US012802732B2

(12) United States Patent
Irizarry et al.

(10) Patent No.: US 12,802,732 B2
(45) Date of Patent: Nov. 17, 2026

(54) APPARATUS AND METHODS FOR DECODER MODULE ARCHITECTURES FOR NON-VOLATILE MEMORY

(71) Applicant: Sandisk Technologies, Inc., Milpitas, CA (US)

(72) Inventors: Nicolas Irizarry, Folsom, CA (US); Christopher J. Petti, Mountain View, CA (US); Jaydip Patel, Folsom, CA (US); Ashraf B. Islam, El Dorado Hills, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 35 days.

(21) Appl. No.: 18/676,166

(22) Filed: May 28, 2024

(65) Prior Publication Data

US 2025/0372137 A1 Dec. 4, 2025

(51) Int. Cl.
*G11C 11/16* (2006.01)
*H10B 61/00* (2023.01)
*H10N 50/10* (2023.01)

(52) U.S. Cl.
CPC ...... *G11C 11/1657* (2013.01); *G11C 11/1655* (2013.01); *H10B 61/10* (2023.02); *H10N 50/10* (2023.02)

(58) Field of Classification Search
CPC ............ G11C 11/1655; G11C 11/1657; G11C 11/1673; G11C 13/0028; G11C 13/0026; G11C 11/16; G11C 11/1659; G11C 11/1675; G11C 13/004; G11C 13/0069; G11C 2213/79; G11C 11/1653; G11C 11/161; G11C 13/003; G11C 16/0483; G11C 16/08; G11C 16/24; G11C 2213/71; G11C 2213/74; G11C 8/16; G11C 11/5642; G11C 16/26; G11C 11/005; G11C 11/2257; G11C 11/418; G11C 11/419; G11C 11/5607; G11C 11/5678; G11C 11/5685; G11C 13/0007; G11C 14/0081; G11C 14/009; G11C 2211/5642; G11C 2213/31; G11C 2213/32; G11C 11/063; G11C 11/1677; G11C 11/2255; G11C 11/4074; G11C 11/54; G11C 11/56
See application file for complete search history.

(56) References Cited

U.S. PATENT DOCUMENTS

| | | | | |
|---|---|---|---|---|
| 5,349,552 | A | 9/1994 | Zampaglione | |
| 10,347,328 | B2 * | 7/2019 | Chevallier ............ | G11C 11/418 |

* cited by examiner

*Primary Examiner* — Wael M Fahmy
(74) *Attorney, Agent, or Firm* — PEARL COHEN LLP

(57) ABSTRACT

A non-volatile memory includes a memory array including non-volatile memory cells and a first decoder module coupled to the memory array. The first decoder module includes word line decoders coupled to the non-volatile memory cells, bit line decoders coupled to the non-volatile memory cells, a first cluster including a first set of the word line decoders and the bit line decoders, a second cluster including a second set of the word line decoders and the bit line decoders, and a region surrounding and separating the first cluster and the second cluster. The first set of the word line decoders and the bit line decoders abut one another and the second set of the word line decoders and the bit line decoders abut one another.

18 Claims, 24 Drawing Sheets

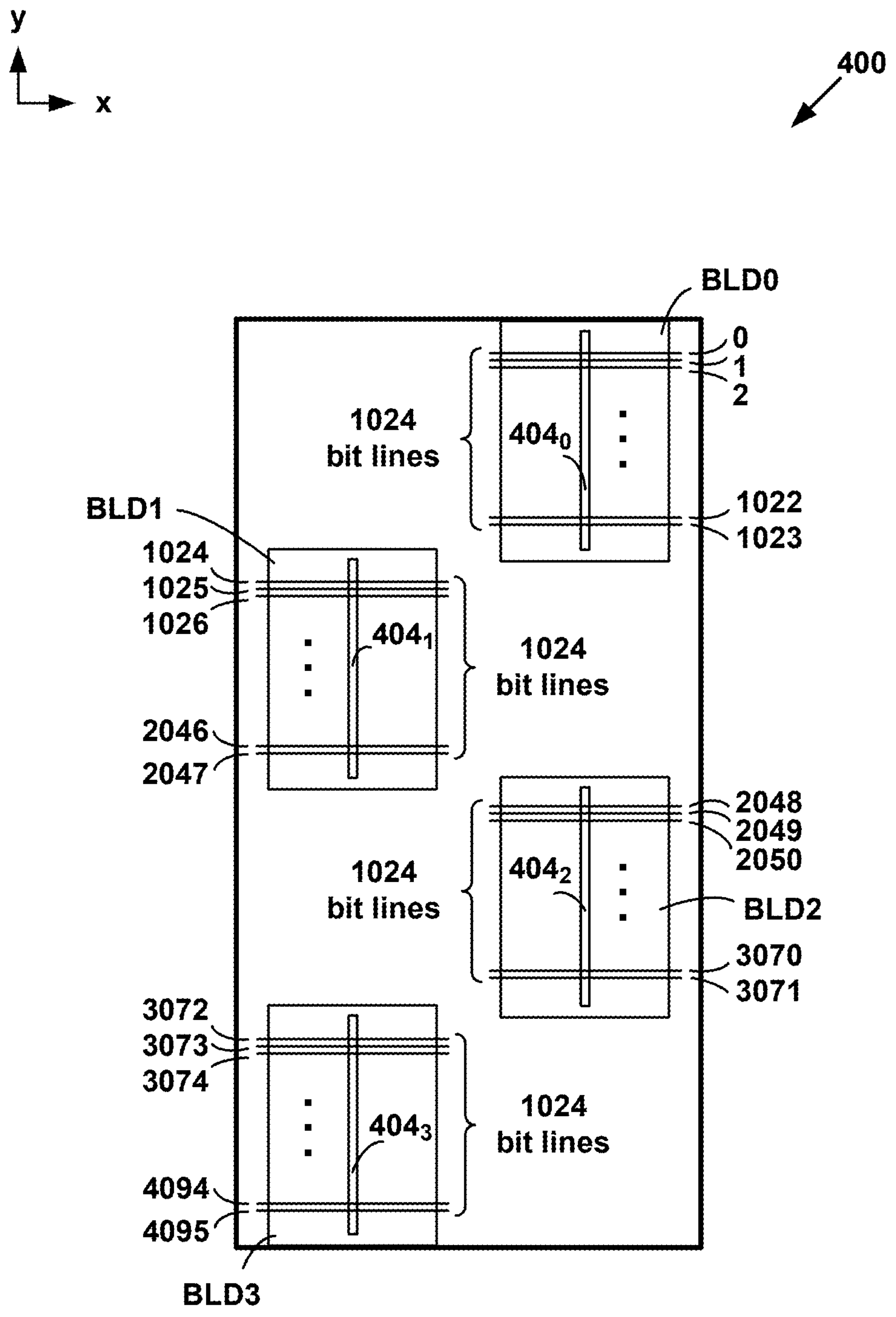
FIG. 4B1

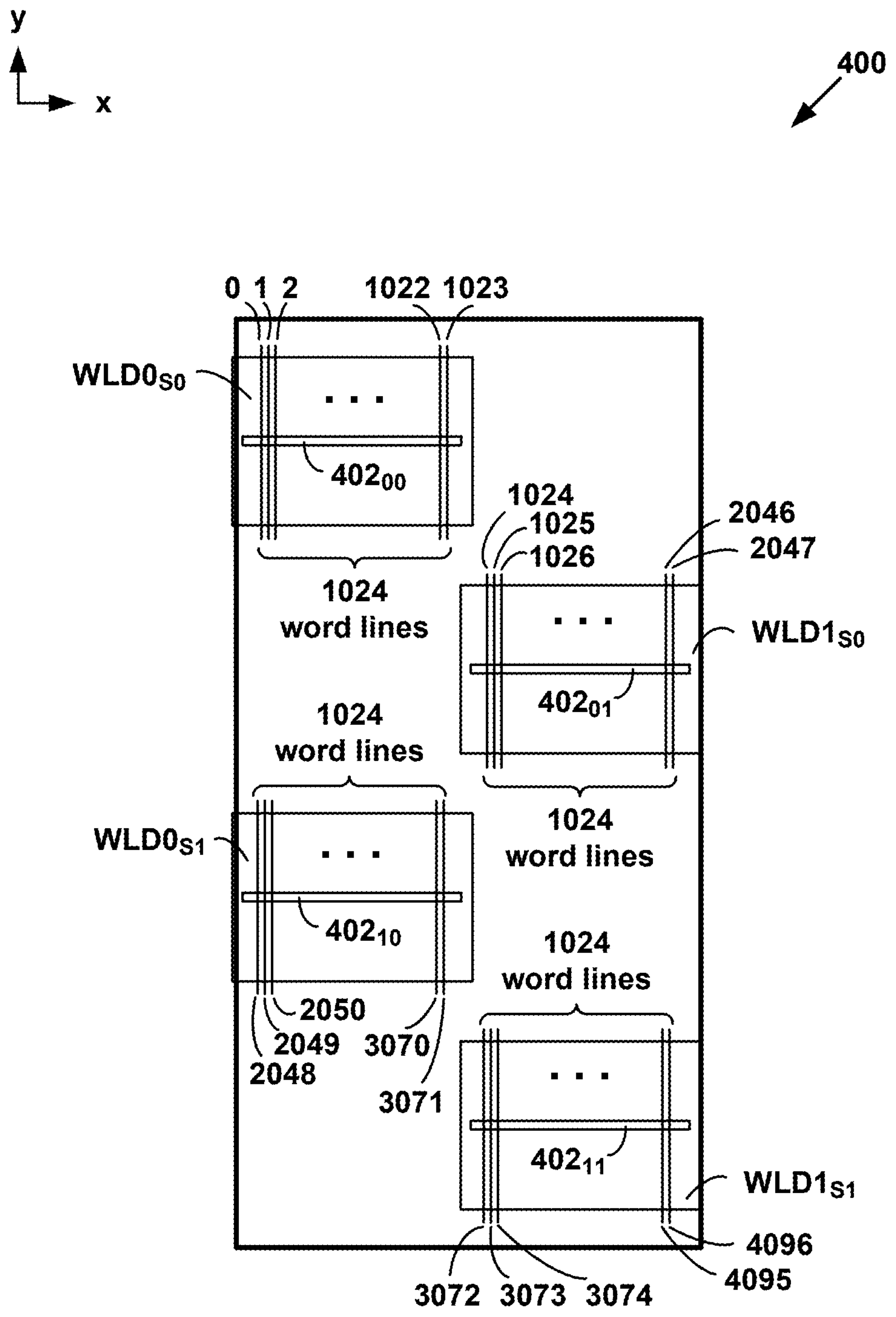
FIG. 4B2

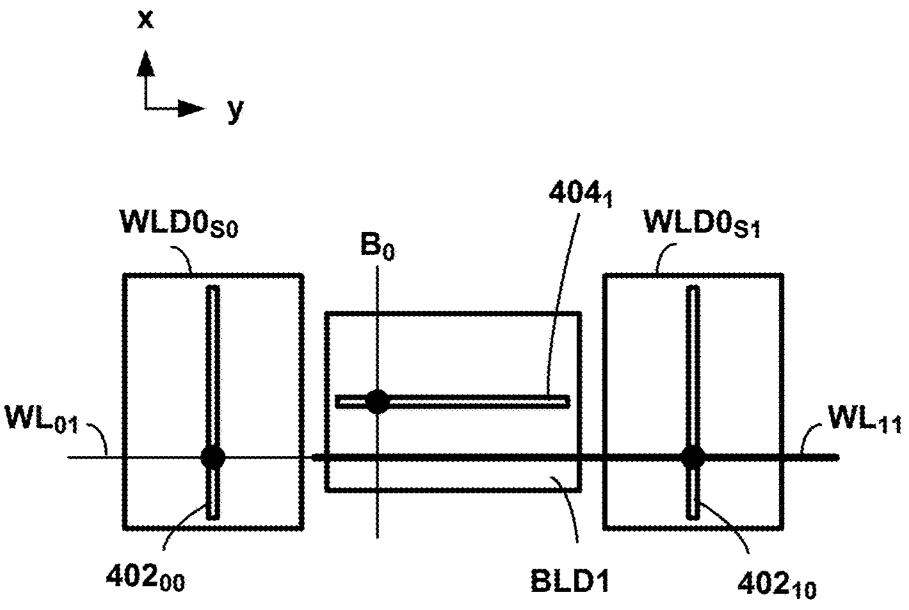
FIG. 4C1
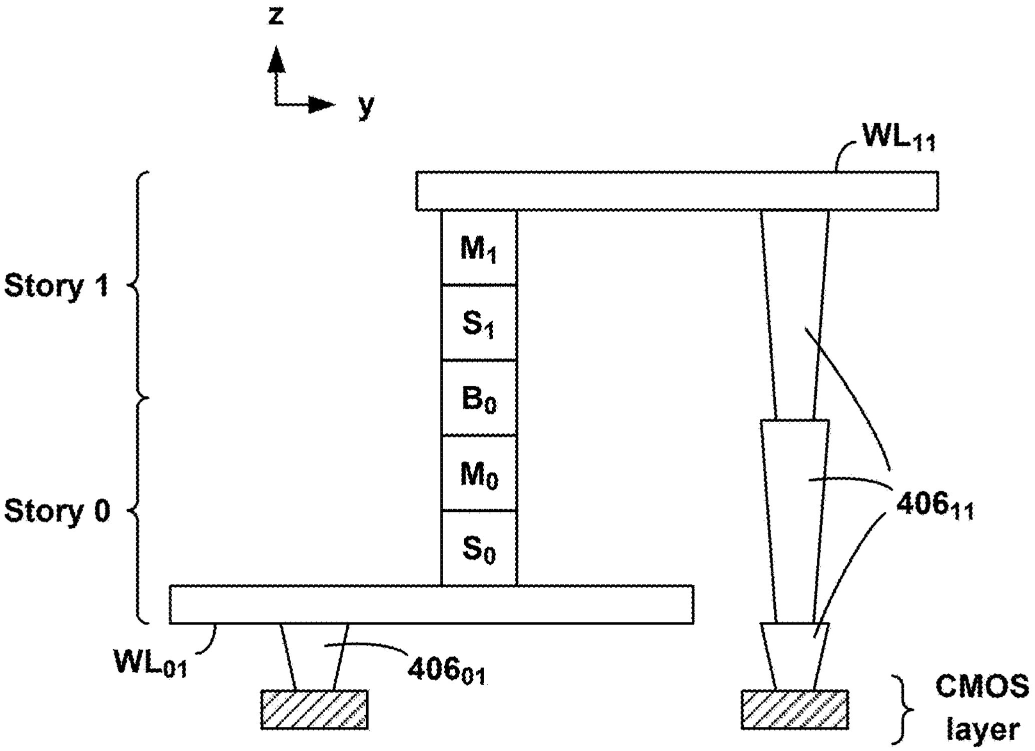
FIG. 4C2

APPARATUS AND METHODS FOR DECODER MODULE ARCHITECTURES FOR NON-VOLATILE MEMORY

BACKGROUND

Memory is widely used in various electronic devices such as cellular telephones, digital cameras, personal digital assistants, medical electronics, mobile computing devices, non-mobile computing devices and data servers. Memory may be non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to some other memory technologies that store data using electronic charge. Generally, MRAM includes a large number of magnetic memory cells formed on a semiconductor substrate, where each memory cell represents one bit of data.

A data bit is written to a memory cell by changing the direction of magnetization of a magnetic element within the memory cell, and a bit is read by measuring the resistance of the memory cell (low resistance typically represents a "0" bit, and high resistance typically represents a "1" bit). As used herein, direction of magnetization is the direction of orientation of the magnetic moment. Some memory cells may include a selector device, such as an ovonic threshold switch or other selector device.

Although MRAM is a promising technology, numerous design and process challenges remain.

BRIEF DESCRIPTION OF THE DRAWINGS

FIGS. 4B1-4B2 depict top views of example embodiments of the decoder module of FIG. 4A FIGS. 4C1-4C2 depict top and cross-sectional views of a portion of the example decoder module of FIGS. 4B1-4B2.

DETAILED DESCRIPTION

Some non-volatile memory devices include an array of non-volatile memory cells and decoder modules that each include word line decoders and bit line decoders coupled to word lines and bit lines, respectively, coupled to non-volatile memory cells of the memory array. Additional circuits, such as current mirrors, voltage clamps, sense amplifiers, level shifting logic, and other similar circuits (collectively referred to herein as "Local Circuits") perform various operations on the word lines and bit lines coupled to the word lined decoders and bit line decoders.

When memory operations (e.g., reading, writing erasing) are to be performed on the memory cells, the word line decoders and bit line decoders are used to select particular memory cells on which the memory operations are to be performed, and the Local Circuits apply various voltages to the word lines and bit lines of the selected memory cells.

The physical arrangement of the word line decoders and the bit line decoders within each decoder module (commonly referred to as a "floorplan") often involves tradeoffs between various factors, such as size, features, and power consumption. Increasing features may improve performance of the non-volatile memory device, but often requires increasing the size of the decoder modules (which in turn increases cost) and may require increasing power consumptions (which may limit use in applications requiring low power).

A decoder module floorplan may be determined by first arranging the layout of the word line decoders and the bit line decoders, and then fitting the Local Circuits in whatever space remains around the word line decoders and the bit line decoders. This space is often quite limited, and not optimized for fitting the Local Circuits. As a result, layout designers often struggle with placement and arrangement of the Local Circuits.

Technology is described for decoder module floorplans and layout methods that may increase space available for fitting Local Circuits and/or may provide more useable space available for fitting Local Circuits.

Figure 1A:
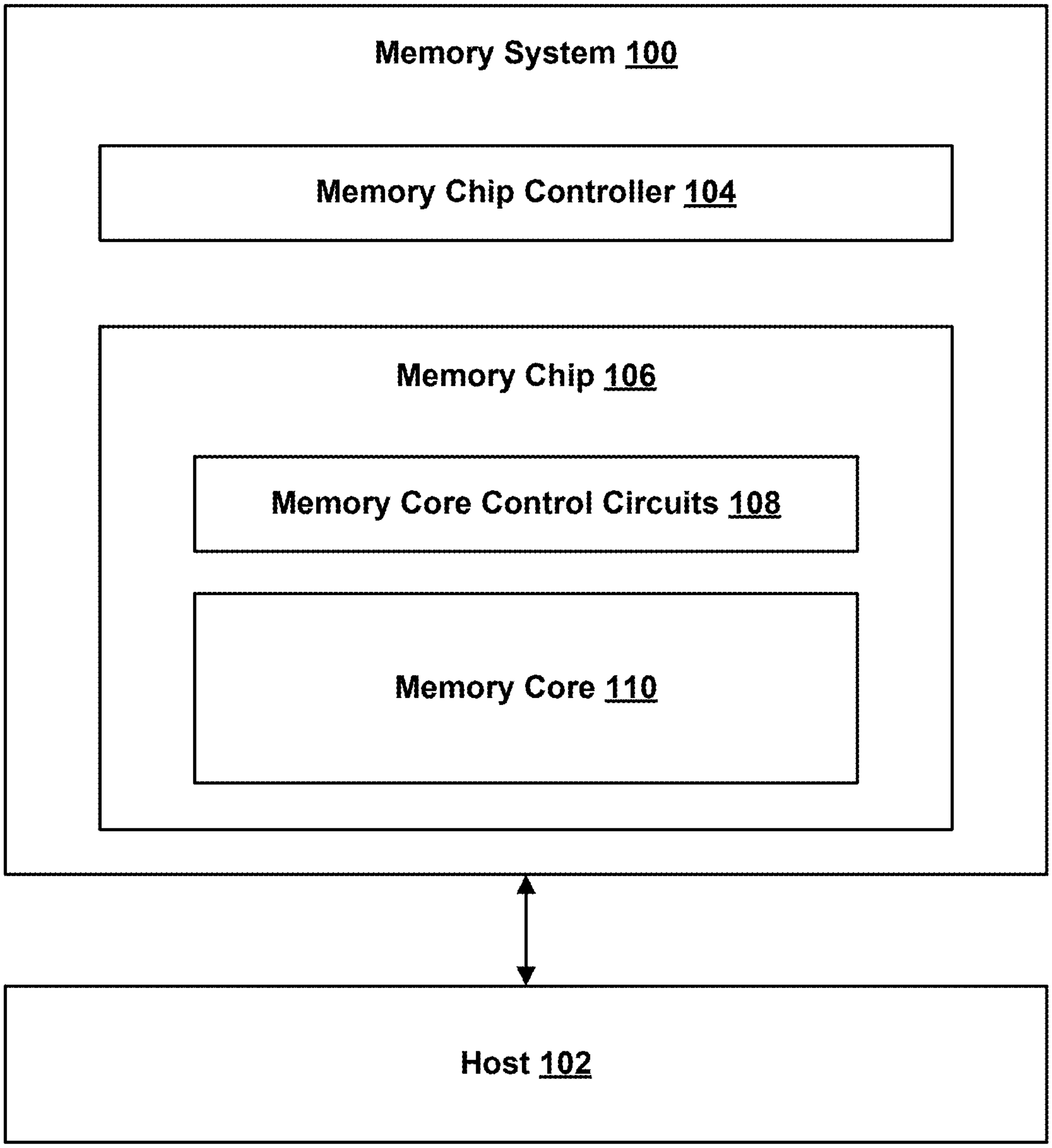
FIGS. 1A-1H depict various embodiments of a memory system.

FIG. 1A depicts one embodiment of a memory system 100 and a host 102. Memory system 100 may include a non-volatile storage system interfacing with host 102 (e.g., a mobile computing device or a server). In some cases, memory system 100 may be embedded within host 102. As examples, memory system 100 may be a memory card, a solid-state drive (SSD) such as a high-density MLC SSD (e.g., 2-bits/cell or 3-bits/cell) or a high performance SLC SSD, or a hybrid HDD/SSD drive.

As depicted, memory system 100 includes a memory chip controller 104 and a memory chip 106. Memory chip 106 may include volatile memory and/or non-volatile memory. Although a single memory chip is depicted, memory system 100 may include more than one memory chip. Memory chip controller 104 may receive data and commands from host 102 and provide memory chip data to host 102.

Memory chip controller 104 may include one or more of control circuitry, state machines, page registers, SRAM, decoders, sense amplifiers, read/write circuits, and/or controllers, or any combination thereof, for controlling the operation of memory chip 106. The one or more control circuitry, state machines, page registers, SRAM, decoders, sense amplifiers, read/write circuits, and/or controllers for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit or arranged on a single die. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, and generating row and column addresses.

Memory core 110 may include one or more two-dimensional arrays of memory cells and/or one or more three-dimensional arrays of memory cells. In an embodiment, memory core 110 may include re-writable memory cells, one-time programmable memory cells, and/or multi-time programmable memory cells, or any combination thereof.

In an embodiment, memory core control circuits 108 and memory core 110 may be arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 may send to memory chip controller 104 both a write command and the data to be written.

Memory chip controller 104 may buffer data to be written and may generate error correction code (ECC) data corresponding with the data to be written. The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 may control operation of memory chip 106. In an example, before issuing a write operation to memory chip 106, memory chip controller 104 may check a status register to make sure that memory chip 106 is able to accept the data to be written.

In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested.

Once memory chip controller 104 initiates a read or write operation, memory core control circuits 108 may generate appropriate bias voltages and/or currents for word lines and bit lines within memory core 110, as well as generate the appropriate memory block, row, and column addresses.

Figure 1B:
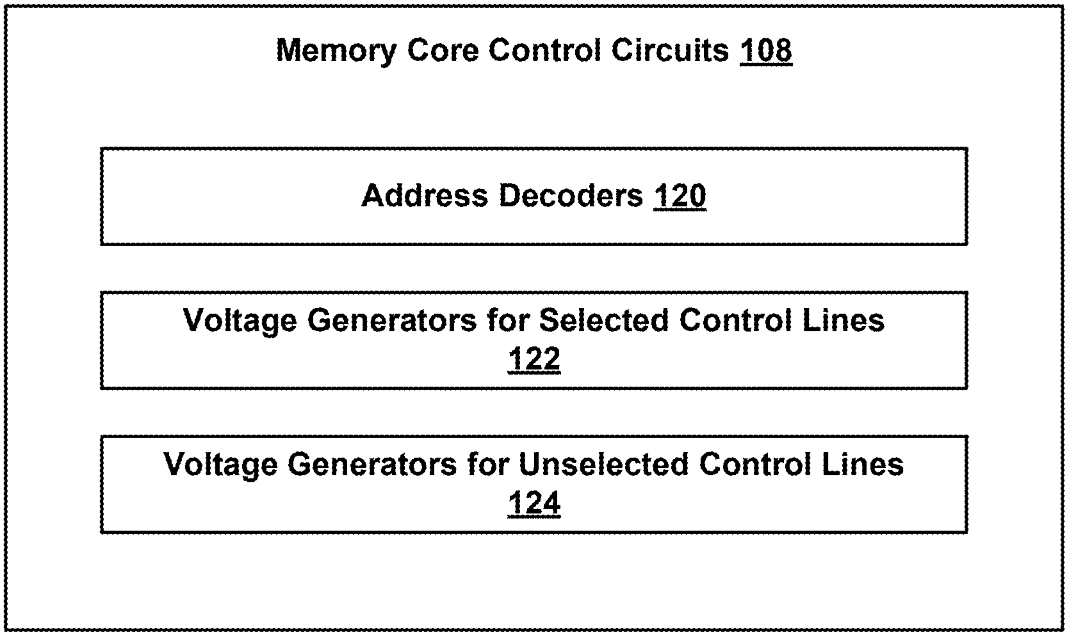

FIG. 1B depicts an embodiment of memory core control circuits 108. In an embodiment, memory core control circuits 108 include address decoders 120, voltage generators for selected control lines 122, and voltage generators for unselected control lines 124. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state.

Voltage generators (or voltage regulators) for selected control lines 122 may include one or more voltage generators for generating selected control line voltages. Voltage generators for unselected control lines 124 may include one or more voltage generators for generating unselected control line voltages. Address decoders 120 may generate memory block addresses, as well as row addresses and column addresses for a particular memory block.

FIGS. 1C-1F depict one embodiment of a memory core organization that includes a memory core 110 having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
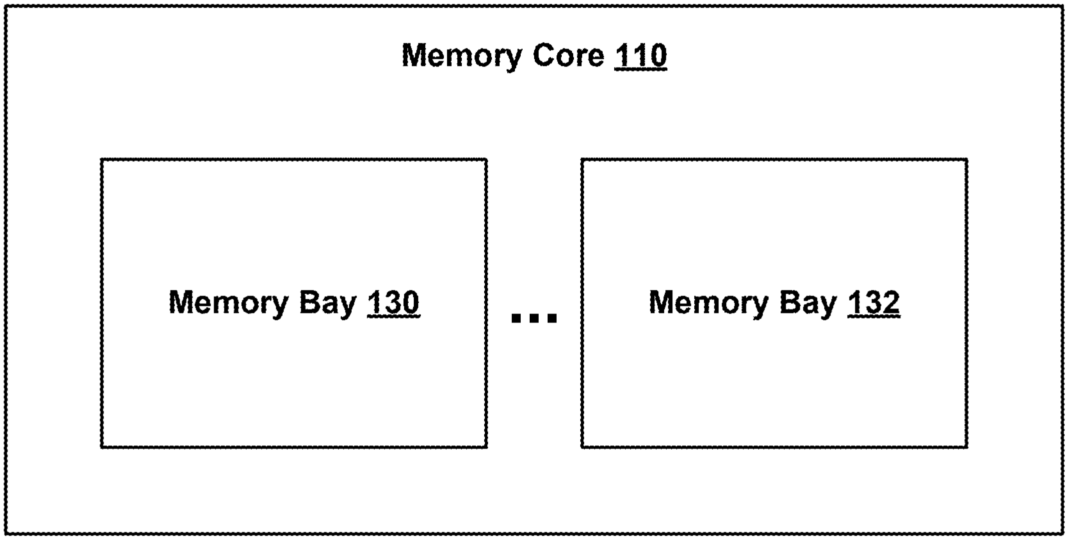

FIG. 1C depicts an embodiment of memory core 110 of FIG. 1A. As depicted, memory core 110 includes memory bay 130 and memory bay 132. In some embodiments, the number of memory bays per memory core can be different for different implementations. For example, a memory core may include only a single memory bay or multiple memory bays (e.g., 16 memory bays, 256 memory bays, etc.).

Figure 1D:
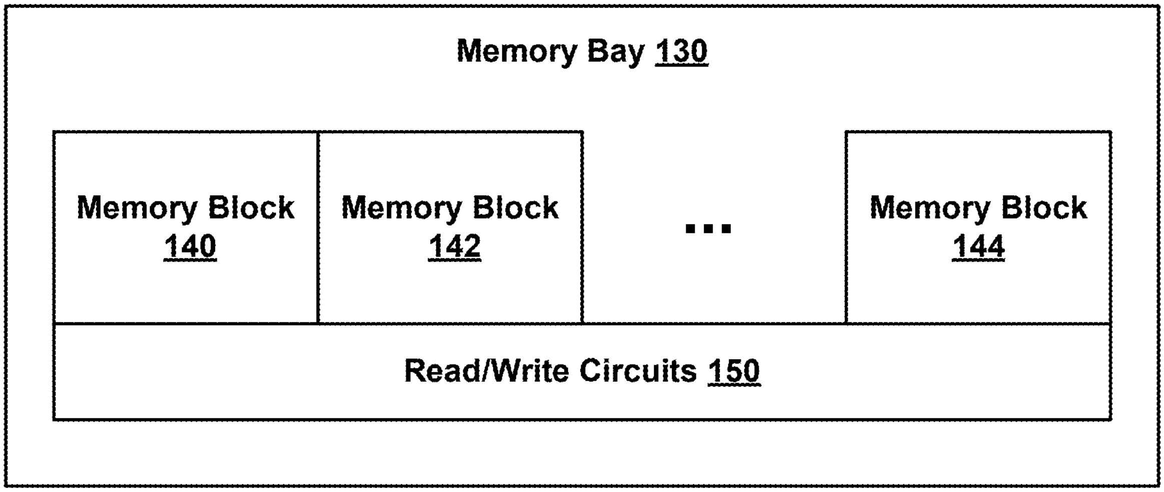

FIG. 1D depicts one embodiment of memory bay 130 of FIG. 1C. As depicted, memory bay 130 includes memory blocks 140-144 and read/write circuits 150. In some embodiments, the number of memory blocks per memory bay may be different for different implementations. For example, a memory bay may include one or more memory blocks (e.g., 32 memory blocks per memory bay).

Read/write circuits 150 include circuitry for reading and writing memory cells within memory blocks 140-144. As depicted, read/write circuits 150 may be shared across multiple memory blocks within a memory bay. This allows chip area to be reduced because a single group of read/write circuits 150 may be used to support multiple memory blocks. However, in some embodiments, only a single memory block may be electrically coupled to read/write circuits 150 at a particular time to avoid signal conflicts.

In some embodiments, read/write circuits 150 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In an example, memory system 100 of FIG. 1A may receive a write command including a target address and a set of data to be written to the target address. Memory system 100 may perform a read-before-write (RBW) operation to read the data currently stored at the target address before performing a write operation to write the set of data to the target address. Memory system 100 may then determine whether a particular memory cell may stay at its current state (i.e., the memory cell is already at the correct state), needs to be set to a “0” state, or needs to be reset to a “1” state.

Memory system 100 may then write a first subset of the memory cells to the “0” state and then write a second subset of the memory cells to the “1” state. The memory cells that are already at the correct state may be skipped over, thereby improving programming speed and reducing the cumulative voltage stress applied to unselected memory cells.

A particular memory cell may be SET to the "1" state by applying a first voltage difference across the particular memory cell of a first polarity (e.g., +1.5V). The particular memory cell may be RESET to the "0" state by applying a second voltage difference across the particular memory cell of a second polarity that is opposite to that of the first polarity (e.g., −1.5V).

In some cases, read/write circuits 150 may be used to program a particular memory cell to be in one of three or more data/resistance states (i.e., the particular memory cell may comprise a multi-level memory cell). In an example, read/write circuits 150 may apply a first voltage difference (e.g., 2V) across the particular memory cell to program the particular memory cell to a first state of the three or more data/resistance states, or a second voltage difference (e.g., 1V) across the particular memory cell that is less than the first voltage difference to program the particular memory cell to a second state of the three or more data/resistance states.

Applying a smaller voltage difference across the particular memory cell may cause the particular memory cell to be partially programmed or programmed at a slower rate than when applying a larger voltage difference. In another example, read/write circuits 150 may apply a first voltage difference across the particular memory cell for a first time period (e.g., 150 ns) to program the particular memory cell to a first state of the three or more data/resistance states, or apply the first voltage difference across the particular memory cell for a second time period less than the first time period (e.g., 50 ns). One or more programming pulses followed by a memory cell verification phase may be used to program the particular memory cell to be in the correct state.

Figure 1E:
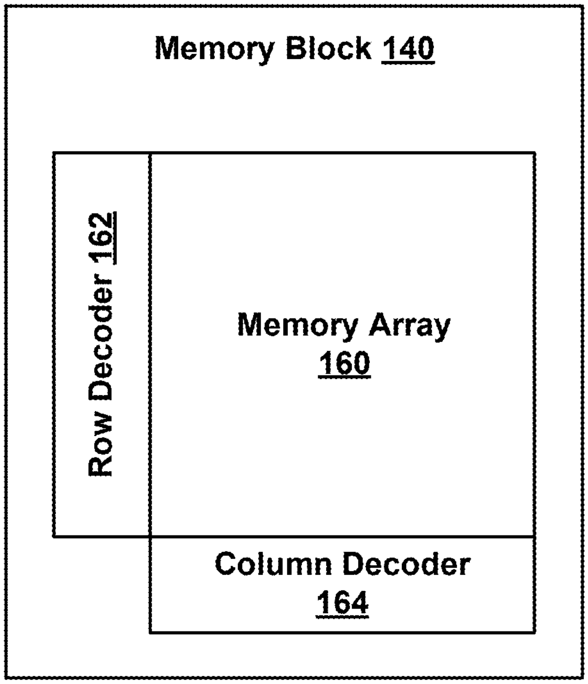

FIG. 1E depicts one embodiment of memory block 140 of FIG. 1D. As depicted, memory block 140 includes a memory array 160, a row decoder 162, and a column decoder 164. Memory array 160 may include a contiguous group of memory cells having contiguous word lines and bit lines. Memory array 160 may include one or more layers of memory cells, and may include a two-dimensional memory array and/or a three-dimensional memory array.

Row decoder 162 decodes a row address and selects a particular word line in memory array 160 when appropriate (e.g., when reading or writing memory cells in memory array 160). Column decoder 164 decodes a column address and selects a particular group of bit lines in memory array 160 to be electrically coupled to read/write circuits, such as read/write circuits 150 of FIG. 1D. In an embodiment, the number of word lines is 4K per memory layer, the number of bit lines is 1K per memory layer, and the number of memory layers is 4, providing a memory array 160 containing 16M memory cells. Other numbers of word lines per layer, bit lines per layer, and number of layers may be used.

Figure 1F:
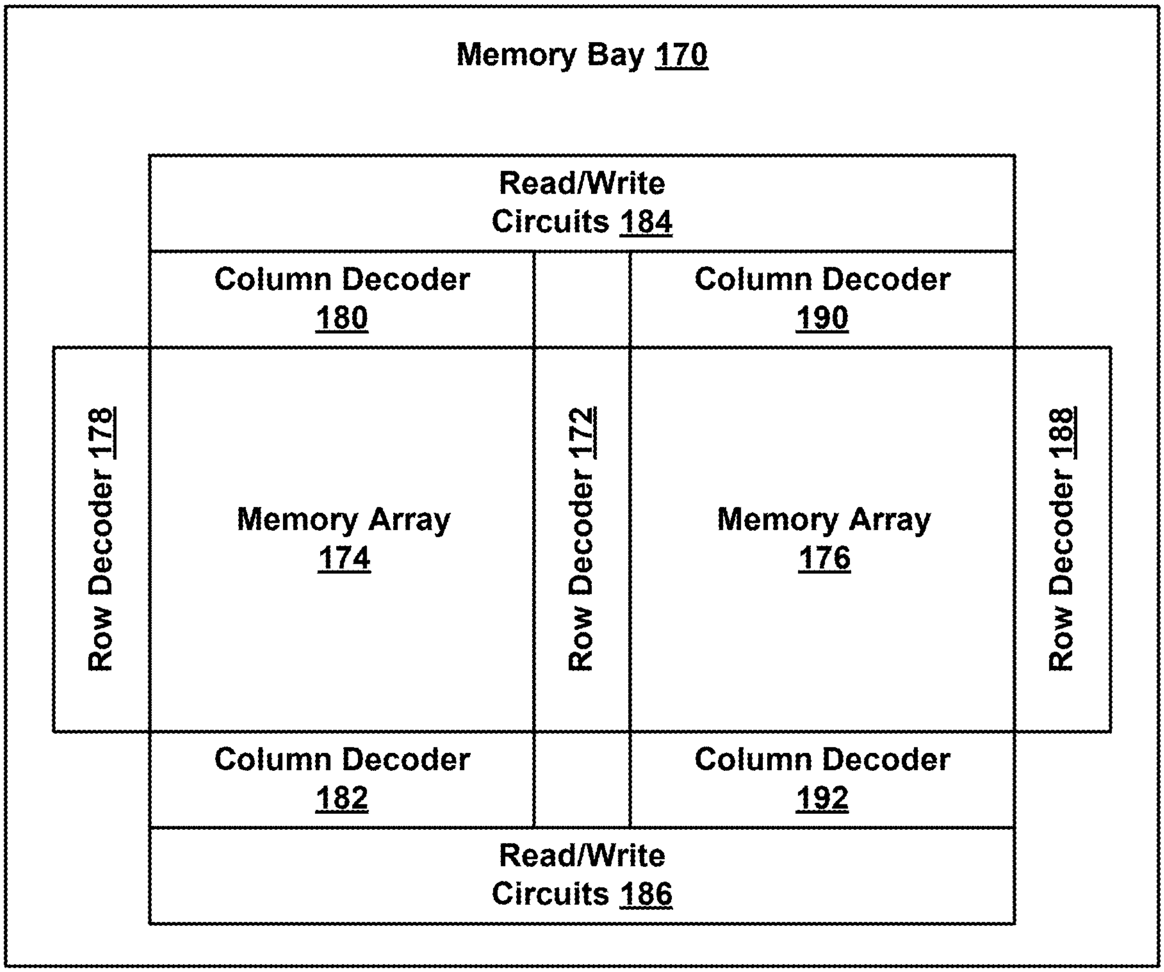

FIG. 1F depicts an embodiment of a memory bay 170. Memory bay 170 is an example of an alternative implementation for memory bay 130 of FIG. 1D. In some embodiments, row decoders, column decoders, and read/write circuits may be split or shared between memory arrays. As depicted, row decoder 172 is shared between memory arrays 174 and 176, because row decoder 172 controls word lines in both memory arrays 174 and 176 (i.e., the word lines driven by row decoder 172 are shared).

Row decoders 172 and 178 may be split such that odd word lines in memory array 174 are driven by row decoder 172 and even word lines in memory array 174 are driven by row decoder 178. Column decoders 180 and 182 may be split such that odd bit lines in memory array 174 are driven by column decoder 180 and even bit lines in memory array 174 are controlled by column decoder 182.

The selected bit lines controlled by column decoder 180 may be electrically coupled to read/write circuits 184. The selected bit lines controlled by column decoder 182 may be electrically coupled to read/write circuits 186. Splitting the read/write circuits into read/write circuits 184 and 186 when the column decoders are split may allow for a more efficient layout of the memory bay.

Row decoders 172 and 188 may be split such that odd word lines in memory array 176 are driven by row decoder 172 and even word lines in memory array 176 are driven by row decoder 188. Column decoders 190 and 192 may be split such that odd bit lines in memory array 176 are driven by column decoder 190 and even bit lines in memory array 176 are controlled by column decoder 192.

The selected bit lines controlled by column decoder 190 may be electrically coupled to read/write circuits 184. The selected bit lines controlled by column decoder 192 may be electrically coupled to read/write circuits 186. Splitting the read/write circuits into read/write circuits 184 and 186 when the column decoders are split may allow for a more efficient layout of the memory bay.

Figure 1G:
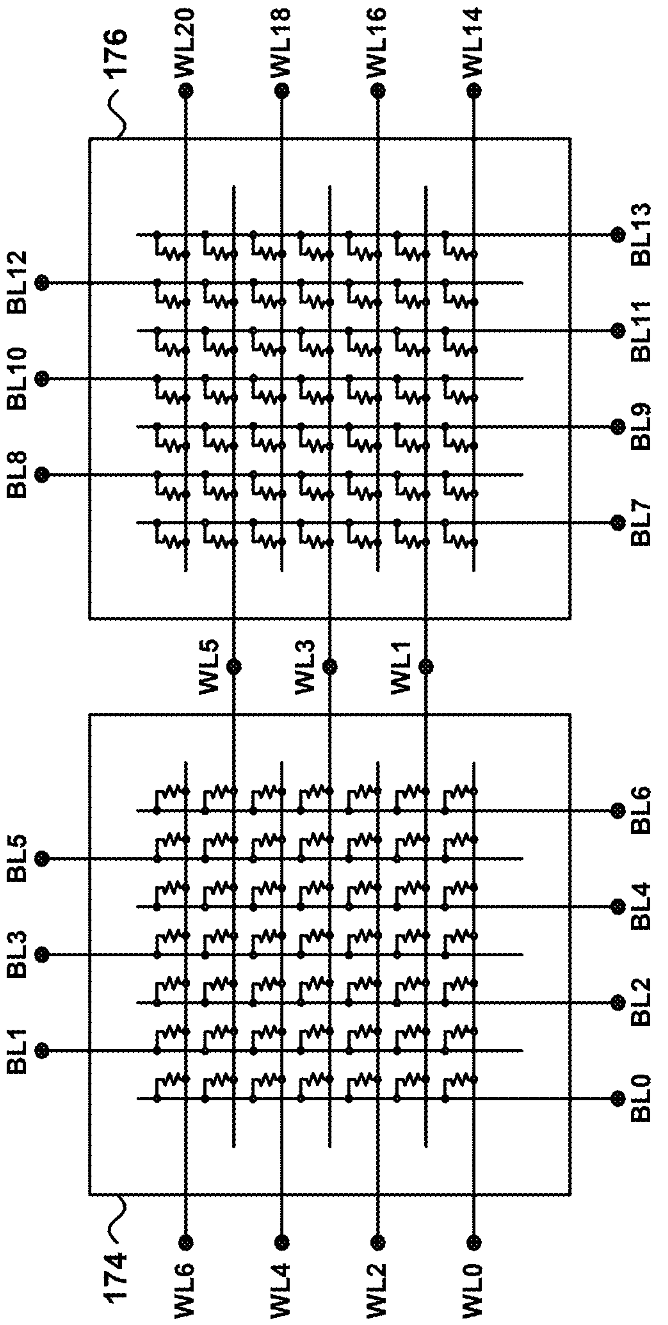

FIG. 1G depicts an embodiment of a schematic diagram (including word lines and bit lines) corresponding with memory bay 170 in FIG. 1F. As depicted, word lines WL1, WL3, and WL5 are shared between memory arrays 174 and 176 and controlled by row decoder 172 of FIG. 1F. Word lines WL0, WL2, WL4, and WL6 are driven from the left side of memory array 174 and controlled by row decoder 178 of FIG. 1F. Word lines WL14, WL16, WL18, and WL20 are driven from the right side of memory array 176 and controlled by row decoder 188 of FIG. 1F.

Bit lines BL0, BL2, BL4, and BL6 are driven from the bottom of memory array 174 and controlled by column decoder 182 of FIG. 1F. Bit lines BL1, BL3, and BL5 are driven from the top of memory array 174 and controlled by column decoder 180 of FIG. 1F. Bit lines BL7, BL9, BL11, and BL13 are driven from the bottom of memory array 176 and controlled by column decoder 192 of FIG. 1F. Bit lines BL8, BL10, and BL12 are driven from the top of memory array 176 and controlled by column decoder 190 of FIG. 1F.

In an embodiment, memory arrays 174 and 176 may include memory layers that are oriented in a plane that is horizontal to the supporting substrate. In another embodiment, memory arrays 174 and 176 may include memory layers that are oriented in a plane that is vertical with respect to the supporting substrate (i.e., the vertical plane is substantially perpendicular to the supporting substrate). In this case, the bit lines of the memory arrays may include substantially vertical bit lines.

Figure 1H:
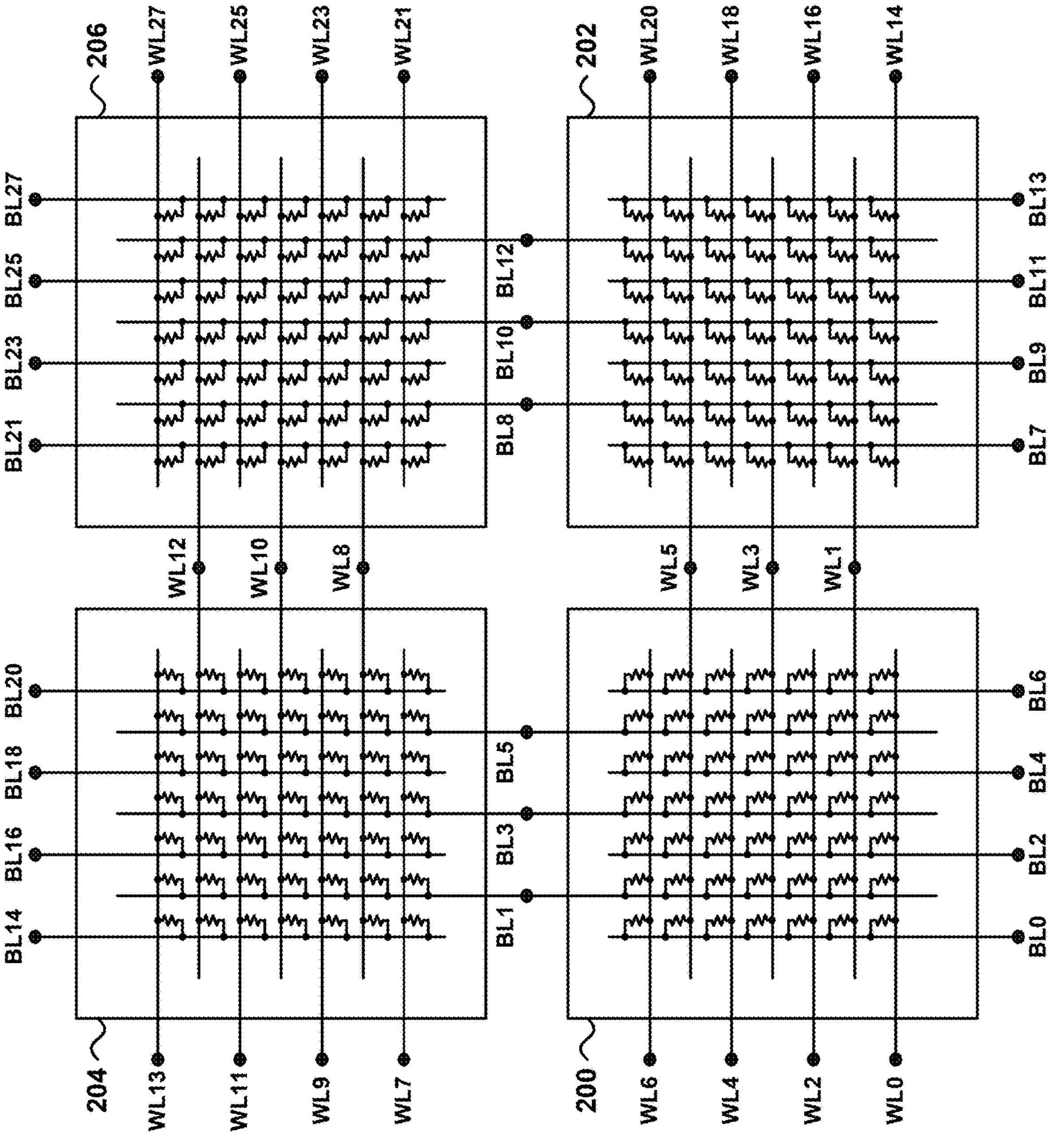

FIG. 1H depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area because a single row decoder and/or column decoder can be used to support two memory arrays.

As depicted, word lines WL1, WL3, and WL5 are shared between memory arrays 200 and 202. Bit lines BL1, BL3, and BL5 are shared between memory arrays 200 and 204. Word lines WL8, WL10, and WL12 are shared between memory arrays 204 and 206. Bit lines BL8, BL10, and BL12 are shared between memory arrays 202 and 206.

Row decoders are split such that word lines WL0, WL2, WL4, and WL6 are driven from the left side of memory array 200 and word lines WL1, WL3, and WL5 are driven from the right side of memory array 200. Likewise, word lines WL7, WL9, WL11, and WL13 are driven from the left side of memory array 204 and word lines WL8, WL10, and WL12 are driven from the right side of memory array 204.

Column decoders are split such that bit lines BL0, BL2, BL4, and BL6 are driven from the bottom of memory array 200 and bit lines BL1, BL3, and BL5 are driven from the top of memory array 200. Likewise, bit lines BL7, BL9, BL11, and BL13 are driven from the bottom of memory array 202 and bit lines BL8, BL10, and BL12 are driven from the top of memory array 202. Splitting row and/or column decoders also helps to relieve layout constraints (e.g., the column decoder pitch can be relieved by 2x since the split column decoders need only drive every other bit line instead of every bit line).

Figure 2A:
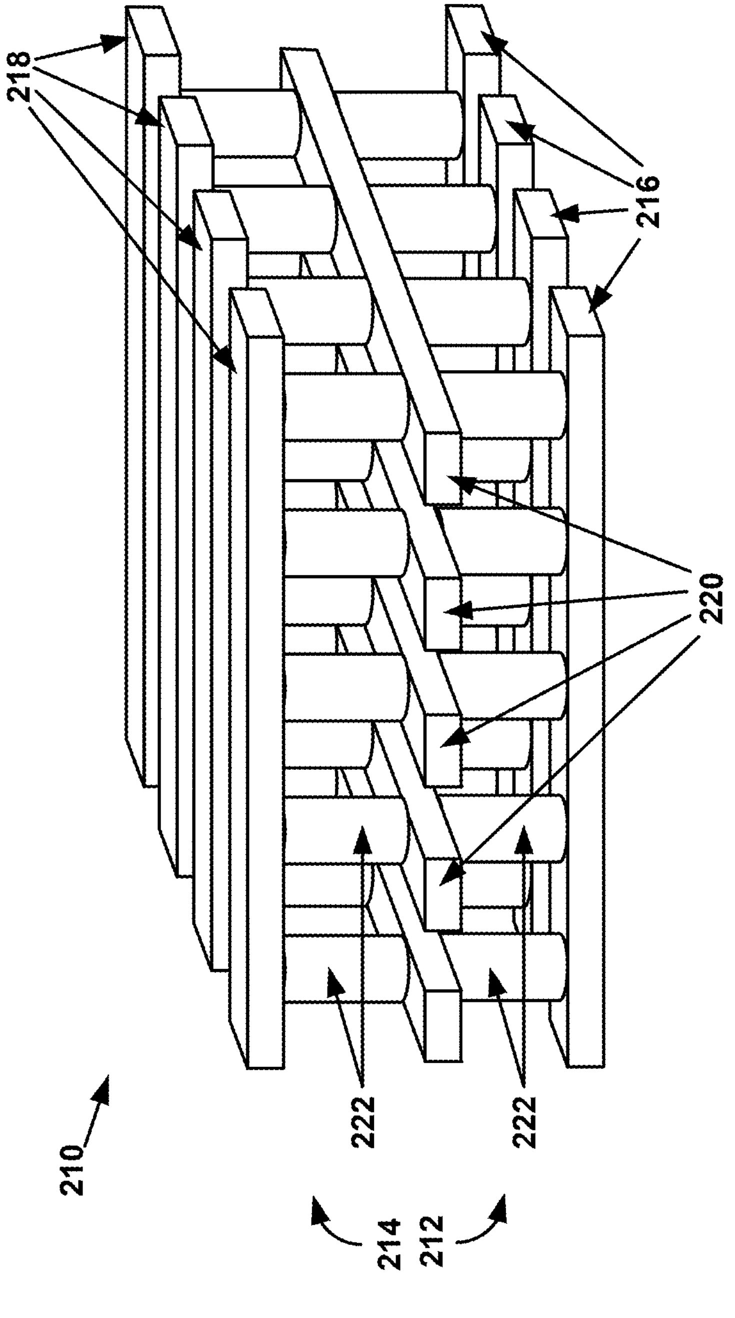
FIG. 2A depicts an embodiment of a portion of a three-dimensional memory array.

FIG. 2A depicts an embodiment of a portion of a monolithic three-dimensional memory array 210 that includes a first memory level 212, and a second memory level 214 positioned above first memory level 212. Memory array 210 is an example of an implementation of memory array 160 in FIG. 1E. Word lines 216 and 218 are arranged in a first direction and bit lines 220 are arranged in a second direction perpendicular to the first direction. As depicted, the upper conductors of first memory level 212 may be used as the lower conductors of second memory level 214. In a memory array with additional layers of memory cells, there would be corresponding additional layers of bit lines and word lines.

Memory array 210 includes a plurality of memory cells 222, where each memory cell is disposed at an intersection between one of word lines 216/218 and one of bit lines 220. A memory array such as memory array 210 is sometimes referred to as a cross-point memory array.

In embodiments, memory cells 222 may include re-writeable memory cells, one-time programmable memory cells, and multi-time programmable memory cells. In an embodiment, each of memory cells 222 are vertically-oriented. Memory cells 222 may include non-volatile memory cells or volatile memory cells. With respect to first memory level 212, a first portion of memory cells 222 are between and connect to word lines 216 and bit lines 220. With respect to second memory level 214, a second portion of memory cells 222 are between and connect to word lines 218 and bit lines 220.

In an embodiment, each memory cell 222 includes a selector element coupled in series with a resistance-switching memory element, where each memory cell 222 represents one bit of data. In an embodiment, the resistance-switching memory element may be a magnetic memory element, a ReRAM memory element, a phase change memory element or other type of resistance-switching memory element.

In an embodiment, each memory cell 222 includes a selector element coupled in series with a magnetic memory element, where each memory cell 222 represents one bit of data. FIG. 2B is a simplified schematic diagram of a memory cell 222*a*, which is one example implementation of memory cells 222 of FIG. 2A.

In an embodiment, memory cell 222*a* includes a magnetic memory element $M_x$ coupled in series with a selector element $S_x$, both coupled between a first terminal T1 and a second terminal T2. In an embodiment, memory cell 222*a* is vertically-oriented. In the embodiment of FIG. 2B, magnetic memory element $M_x$ is disposed above selector element $S_x$. In other embodiments, selector element $S_x$ may be disposed above magnetic memory element $M_x$.

In an embodiment, magnetic memory element $M_x$ is a magnetic tunnel junction, and selector element $S_x$ is a threshold selector device. In an embodiment, selector element $S_x$ is a conductive bridge threshold selector device. In other embodiments, selector element $S_x$ is an ovonic threshold switch (e.g., binary SiTe, CTe, BTe, AlTe, etc., or the ternary type AsTeSi, AsTeGe or AsTeGeSiN, etc.), a Metal Insulator Transition (MIT) of a Phase Transition Material type (e.g., $VO_2$, $NbO_2$ etc.), or other similar threshold selector device.

In an embodiment, magnetic memory element $M_x$ includes an upper ferromagnetic layer 230, a lower ferromagnetic layer 232, and a tunnel barrier (TB) 234 which is an insulating layer between the two ferromagnetic layers. In this example, lower ferromagnetic layer 232 is a free layer (FL) that has a direction of magnetization that can be switched. Upper ferromagnetic layer 230 is the pinned (or fixed) layer (PL) that has a direction of magnetization that is not easily changed.

In other embodiments, magnetic memory element $M_x$ may include fewer, additional, or different layers than those depicted in FIG. 2B. In other embodiments, lower ferromagnetic layer 232 is a pinned layer (PL) and upper ferromagnetic layer 230 is the free layer (FL).

When the direction of magnetization in free layer 232 is parallel to that of pinned layer 230, memory element $M_x$ has a relatively low resistance (referred to herein as the "P state"), and when the direction of magnetization in free layer 232 is anti-parallel to that of pinned layer 230, memory element $M_x$ has a relatively high resistance (referred to herein as the "AP state").

In an embodiment, the data state ("0" or "1") of magnetic memory element $M_x$ is read by measuring the resistance of magnetic memory element $M_x$. By design, both the parallel and anti-parallel configurations remain stable in the quiescent state and/or during a read operation (at sufficiently low read current).

In an embodiment, selector element $S_x$ is an ovonic threshold switch that includes a first region 236 and optionally includes a second region 238 disposed above first region 236. In an embodiment, first region 236 is a SiTe alloy, and optional second region 238 is carbon nitride. Other materials may be used for first region 236 and optional second region 238. In other embodiments, selector element $S_x$ is a conductive bridge threshold selector element. In an embodiment, first region 236 is a solid electrolyte region, and second region 238 is an ion source region.

Figure 2C:
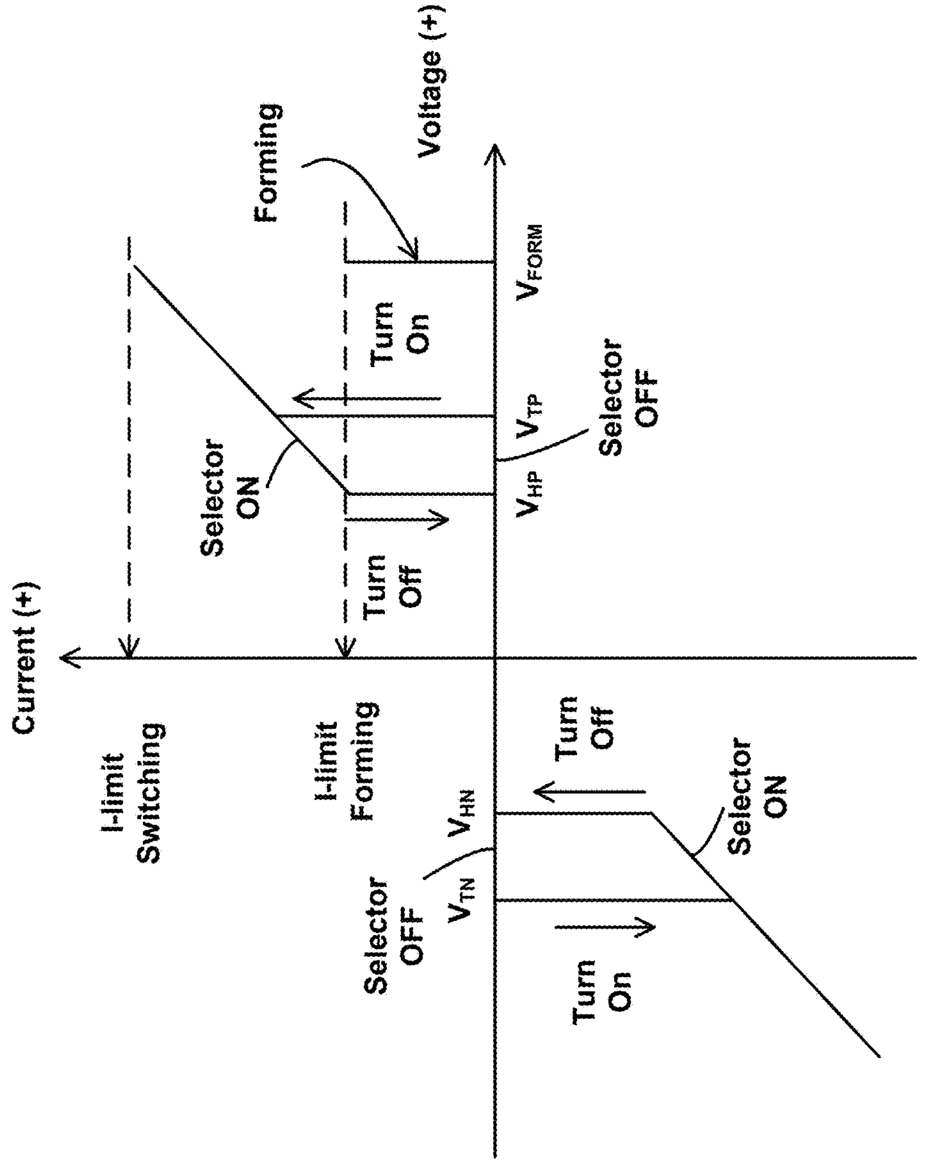
FIG. 2C depicts an example current-voltage characteristic of a threshold selector device of FIG. 2B.
Figure 2B:
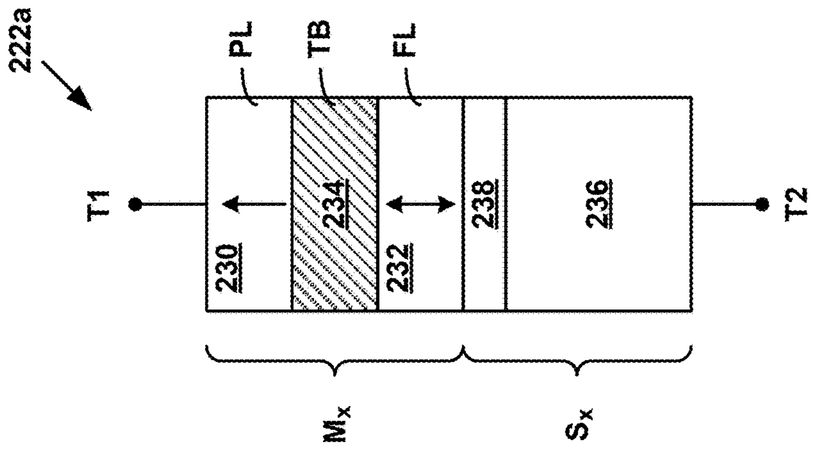
FIG. 2B depicts an embodiment of a memory cell of the three-dimensional memory array of FIG. 2A.

FIG. 2C is a diagram depicting example current-voltage (I-V) characteristics of a threshold selector device $S_x$. Each threshold selector device $S_x$ is initially in a high resistance (OFF) state. To operate threshold selector device $S_x$ as a threshold switch, an initial forming operation may be necessary so that threshold selector device $S_x$ operates in a current range in which switching can occur.

For example, a forming operation may include applying to threshold selector device $S_x$ one or more voltage pulses each having a magnitude greater than or equal to a forming voltage $V_{FORM}$. Following the forming operation, threshold selector device $S_x$ may be switched ON and OFF, and may be used as either a unipolar or a bipolar threshold selector device. Accordingly, threshold selector device $S_x$ may be referred to as a bipolar threshold selector device.

In the example I-V characteristics of FIG. 2C, for positive applied voltages, threshold selector device $S_x$ remains in a high resistance state (HRS) (e.g., OFF) until the voltage across the device meets or exceeds (i.e., is more positive than) a first threshold voltage, $V_{TP}$, at which point threshold selector device $S_x$ switches to a low resistance state (LRS) (e.g., ON). Threshold selector device $S_x$ remains turned ON until the voltage across the device drops to or below a first hold voltage, $V_{HP}$, at which point threshold selector device $S_x$ turns OFF.

For negative applied voltages, threshold selector device $S_x$ remains in a HRS (e.g., OFF) until the voltage across the device meets or exceeds (i.e., is more negative than) a second threshold voltage, $V_{TN}$, at which point threshold selector device $S_x$ switches to a LRS (e.g., ON). Threshold selector device $S_x$ remains turned ON until the voltage across the device increases to or exceeds (i.e., is less negative than) a second hold voltage, $V_{HN}$, at which point threshold selector device $S_x$ turns OFF.

Referring again to FIG. 2B, in an embodiment, magnetic memory element $M_x$ uses spin-transfer-torque (STT) switching. To "set" a bit value of magnetic memory element $M_x$ (i.e., choose the direction of the free layer magnetization), an electrical write current is applied from first terminal T1 to second terminal T2. The electrons in the write current become spin-polarized as they pass through pinned layer 230 because pinned layer 230 is a ferromagnetic metal.

A substantial majority of the conduction electrons in a ferromagnet will have a spin orientation that is parallel to the direction of magnetization, yielding a net spin polarized current. (Electron spin refers to angular momentum, which is directly proportional to but anti-parallel in direction to the magnetic moment of the electron, but this directional distinction will not be used going forward for ease of discussion.)

When the spin-polarized electrons tunnel across TB 234, conservation of angular momentum can result in the imparting of a torque on both free layer 232 and pinned layer 230, but this torque is inadequate (by design) to affect the direction of magnetization of pinned layer 230. Contrastingly, this torque is (by design) sufficient to switch the direction of magnetization of free layer 232 to become parallel to that of pinned layer 230 if the initial direction of magnetization of free layer 232 was anti-parallel to pinned layer 230. The parallel magnetizations will then remain stable before and after such write current is turned OFF.

In contrast, if free layer 232 and pinned layer 230 magnetizations are initially parallel, the direction of magnetization of free layer 232 can be STT-switched to become anti-parallel to that of pinned layer 230 by applying a write current of opposite direction to the aforementioned case. Thus, by way of the same STT physics, the direction of the magnetization of free-layer 232 can be deterministically set into either of two stable orientations by judicious choice of the write current direction (polarity).

In the example described above, spin-transfer-torque (STT) switching is used to "set" a bit value of magnetic memory element $M_x$. In other embodiments, field-induced switching, spin orbit torque (SOT) switching, VCMA (magnetoelectric) switching, or other switching techniques may be employed.

Figure 3A:
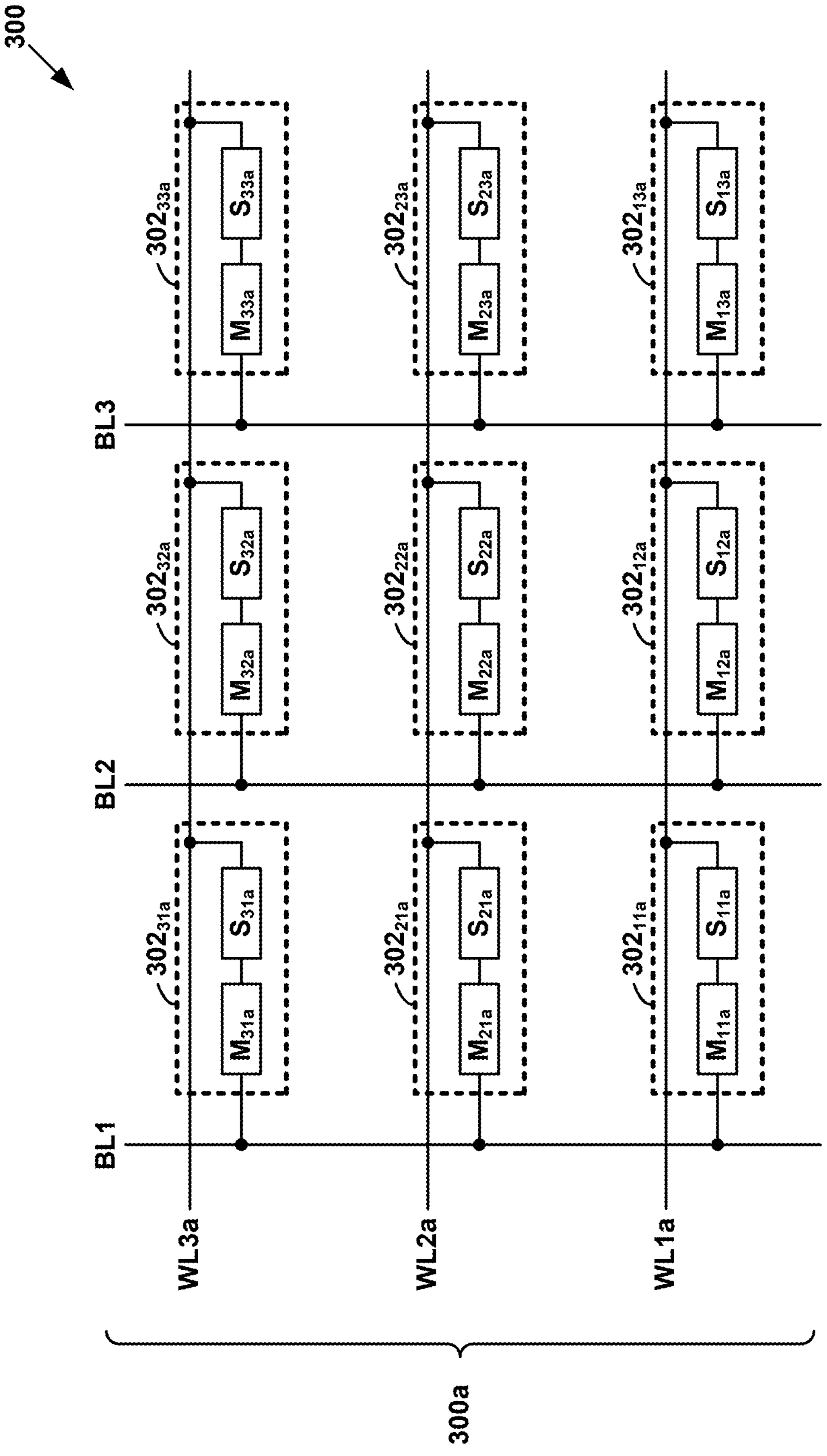
FIGS. 3A-3B depict an embodiment of a cross-point memory array.
Figure 3B:
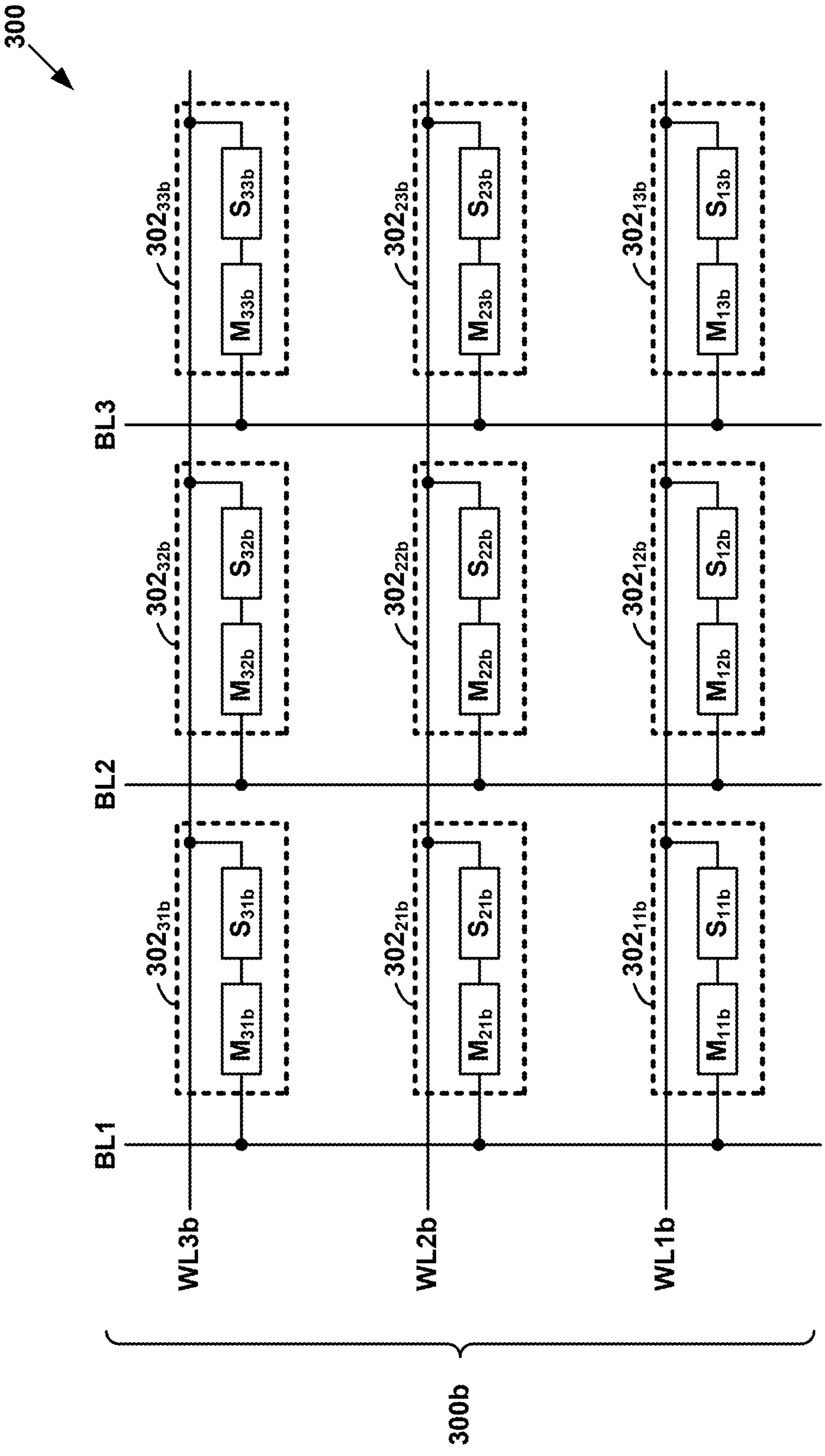

FIGS. 3A-3B are simplified schematic diagrams of an example cross-point memory array 300 which includes a first memory level 300*a*, and a second memory level 300*b* positioned above first memory level 300*a*. Cross-point memory array 300 is an example of an implementation of memory array 160 in FIG. 1E. Cross-point memory array 300 may include more than two memory levels.

Cross-point memory array 300 includes word lines WL1*a*, WL2*a*, WL3*a*, WL1*b*, WL2*b*, and WL3*b*, and bit lines BL1, BL2, and BL3. First memory level 300*a* includes memory cells $\mathbf{302}_{11a}$, $\mathbf{302}_{12a}$, . . . , $\mathbf{302}_{33a}$ coupled to word lines WL1*a*, WL2*a*, WL3*a* and bit lines BL1, BL2, and BL3, and second memory level 300*b* includes memory cells $\mathbf{302}_{11b}$, $\mathbf{302}_{12b}$, . . . , $\mathbf{302}_{33b}$ coupled to word lines WL1*b*, WL2*b*, WL3*b* and bit lines BL1, BL2, and BL3. In an embodiment, each of memory cells $\mathbf{302}_{11a}$, $\mathbf{302}_{12a}$, . . . , $\mathbf{302}_{33a}$ are vertically-oriented. In an embodiment, each of memory cells $\mathbf{302}_{11b}$, $\mathbf{302}_{12b}$, . . . , $\mathbf{302}_{33b}$ are vertically-oriented.

First memory level 300*a* is one example of an implementation for first memory level 212 of monolithic three-dimensional memory array 210 of FIG. 2A, and second memory level 300*b* is one example of an implementation for second memory level 214 of monolithic three-dimensional memory array 210 of FIG. 2A. In an embodiment, each of memory cells $\mathbf{302}_{11a}$, $\mathbf{302}_{12a}$, . . . , $\mathbf{302}_{33a}$, $\mathbf{302}_{11b}$, $\mathbf{302}_{12b}$, . . . , $\mathbf{302}_{33b}$, is an implementation of memory cell 222*a* of FIG. 2B.

Persons of ordinary skill in the art will understand that cross-point memory array 300 may include more or less than six word lines, more or less than three bit lines, and more or less than eighteen memory cells $\mathbf{302}_{11a}$, $\mathbf{302}_{12a}$, . . . , $\mathbf{302}_{33a}$, $\mathbf{302}_{11b}$, $\mathbf{302}_{12b}$, . . . , $\mathbf{302}_{33b}$. In some embodiments, cross-point memory array 300 may include 1000×1000 memory cells, although other array sizes may be used.

Each memory cell $\mathbf{302}_{11a}$, $\mathbf{302}_{12a}$, . . . , $\mathbf{302}_{33a}$, $\mathbf{302}_{11b}$, $\mathbf{302}_{12b}$, . . . , $\mathbf{302}_{33b}$ is coupled to one of the word lines and one of the bit lines, and includes a corresponding magnetic memory element $M_{11a}$, $M_{12a}$, . . . , $M_{33a}$, $M\mathbf{11}_b$, $M_{12b}$, . . . , $M_{33b}$, respectively, coupled in series with a corresponding selector element $S_{11a}$, $S_{12a}$, . . . , $S_{33a}$, $S_{11b}$, $S_{12b}$, . . . , $S_{33b}$, respectively. In an embodiment, each of magnetic memory elements $M_{11a}$, $M_{12a}$, . . . , $M_{33a}$, $M_{11b}$, $M_{12b}$, . . . , $M_{33b}$ is an implementation of magnetic memory element $M_x$ of FIG. 2B, and each of selector elements $S_{11a}$, $S_{12a}$, . . . , $S_{33a}$, $S_{11b}$, $S_{12b}$, . . . , $S_{33b}$ is an implementation of selector element $S_x$ of FIG. 2B.

Each memory cell $\mathbf{302}_{11a}$, $\mathbf{302}_{12a}$, . . . , $\mathbf{302}_{33a}$ has a first terminal coupled to one of bit lines BL1, BL2, BL3, and a second terminal coupled to one of word lines WL1*a*, WL2*a*, WL3*a*, and each memory cell $\mathbf{302}_{11b}$, $\mathbf{302}_{12b}$, . . . , $\mathbf{302}_{33b}$ has a first terminal coupled to one of bit lines BL1, BL2, BL3, and a second terminal coupled to one of word lines WL1*b*, WL2*b*, WL3*b*. For example, memory cell $\mathbf{302}_{13a}$ includes magnetic memory element $M_{13a}$ coupled in series with selector element $S_{13a}$, and includes a first terminal coupled to bit line BL3, and a second terminal coupled to word line WL1*a*.

Likewise, memory cell $\mathbf{302}_{22b}$ includes magnetic memory element $M_{22b}$ coupled in series with selector element $S_{22b}$, and includes a first terminal coupled to bit line BL2, and a second terminal coupled to word line WL2*b*. Similarly, memory cell $\mathbf{302}_{33a}$ includes magnetic memory element $M_{33a}$ coupled in series with selector element $S_{33a}$, and includes a first terminal coupled to bit line BL3, and a second terminal coupled to word line WL3*a*.

Magnetic memory elements $M_{11a}$, $M_{12a}$, . . . , $M_{33a}$ may be disposed above or below corresponding selector elements $S_{11a}$, $S_{12a}$, . . . , $S_{33a}$, respectively, and magnetic memory elements $M_{11b}$, $M_{12b}$, . . . , $M_{33b}$, may be disposed above or below corresponding selector elements $S_{11b}$, $S_{12b}$, . . . , $S_{33b}$, respectively.

In an embodiment, the orientation of memory cells $\mathbf{302}_{11a}$, $\mathbf{302}_{12a}$, . . . , $\mathbf{302}_{33a}$ of first memory level 300*a* is the same as the orientation of memory cell $\mathbf{302}_{11b}$, $\mathbf{302}_{12b}$, . . . , $\mathbf{302}_{33b}$ of second memory level 300*b*.

In another embodiment, the orientation of memory cells $\mathbf{302}_{11a}$, $\mathbf{302}_{12a}$, . . . , $\mathbf{302}_{33a}$ of first memory level 300*a* is opposite the orientation of memory cell $302_{11b}$, $302_{12b}$, . . . $302_{33b}$ of second memory level 300*b*.

Referring again to FIG. 1A, in an embodiment memory core 110 may include one or more two-dimensional arrays of memory cells and/or one or more three-dimensional arrays of memory cells. In an embodiment, memory core 110 may include re-writable memory cells, one-time programmable memory cells, and/or multi-time programmable memory cells, or any combination thereof.

As described above in connection with FIG. 1E, in an embodiment memory block 140 includes a memory array 160, a row decoder 162, and a column decoder 164. In an embodiment, row decoder 162 decodes a row address and selects a particular word line in memory array 160, and column decoder 164 decodes a column address and selects a particular group of bit lines in memory array 160.

In embodiments, the row decoders (such as row decoder 162), and column decoders (such as column decoder 164) are arranged in an architecture that includes multiple decoder modules, with each decoder module including a first number $N_W$ of word line decoders and a second number $N_B$ of bit line decoders.

Figure 4A:
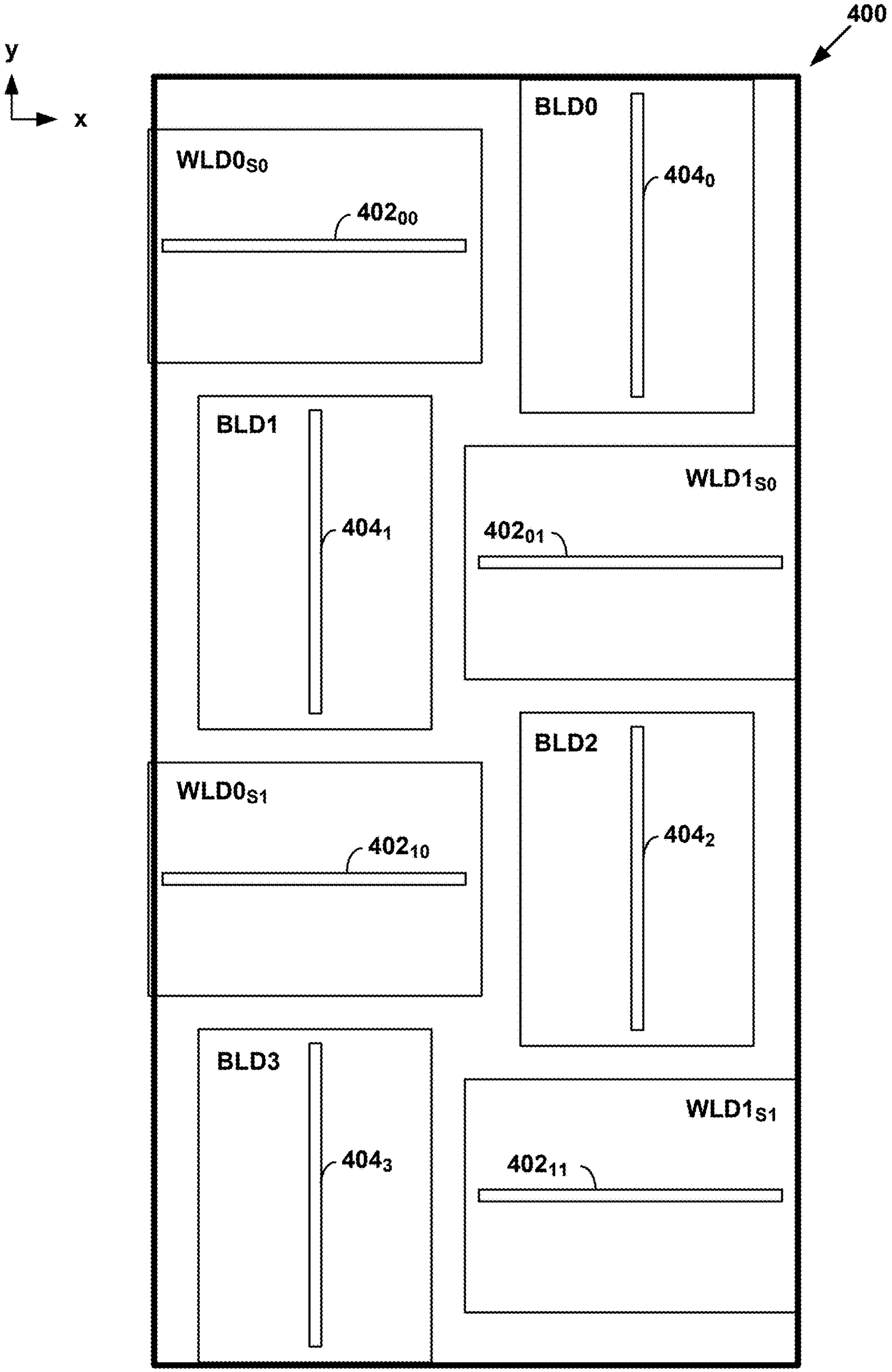
FIG. 4A depicts a top view of an embodiment of a decoder module of word line decoders and bit line decoders.

FIG. 4A depicts a top view of an embodiment of such a decoder module 400, which includes first number $N_W$=4 word line decoders WLD$\mathbf{0}_{S0}$, WLD$\mathbf{1}_{S0}$, WLD$\mathbf{0}_{S1}$ and WLD$\mathbf{1}_{S1}$, and $N_B$=4 bit line decoders BLD0, BLD1, BLD2 and BLD3. Persons of ordinary skill in the art will understand that decoder module 400 alternatively may include more than or fewer than 4 word line decoders and 4 bit line decoders.

In an embodiment, each of word line decoders WLD$\mathbf{0}_{S0}$, WLD$\mathbf{1}_{S0}$, WLD$\mathbf{0}_{S1}$ and WLD$\mathbf{1}_{S1}$ includes a corresponding word line hookup region $\mathbf{402}_{00}$, $\mathbf{402}_{01}$, $\mathbf{402}_{10}$ and $\mathbf{402}_{11}$, respectively, and each of bit line decoders BLD0, BLD1, BLD2 and BLD3 includes a corresponding bit line hook up region $\mathbf{404}_0$, $\mathbf{404}_1$, $\mathbf{404}_2$ and $\mathbf{404}_3$, respectively.

In embodiments, each of word line decoders WLD$\mathbf{0}_{S0}$, WLD$\mathbf{1}_{S0}$, WLD$\mathbf{0}_{S1}$ and WLD$\mathbf{1}_{S1}$ is coupled to a third number $N_{WL}$ of word lines via the corresponding word line hookup region 402, and each of bit line decoders BLD0, BLD1, BLD2 and BLD3 is coupled to a fourth number $N_{BL}$ of bit lines via the corresponding bit line hook up region 404. To avoid overcrowding the drawing FIG. 4A does not depict the word lines or bit lines.

FIGS. 4B1-4B2 depict top views of example embodiments of decoder module 400 of FIG. 4A, in which each of word line decoders WLD$\mathbf{0}_{S0}$, WLD$\mathbf{1}_{S0}$, WLD$\mathbf{0}_{S1}$ and WLD$\mathbf{1}_{S1}$ is coupled to third number $N_{WL}$=1024 word lines, and each of bit line decoders BLD0, BLD1, BLD2 and BLD3 is coupled to fourth number $N_{BL}$=1024 bit lines. Persons of ordinary skill in the art will understand that each of word line decoders WLD$\mathbf{0}_{S0}$, WLD$\mathbf{1}_{S0}$, WLD$\mathbf{0}_{S1}$ and WLD$\mathbf{1}_{S1}$ alternatively may be coupled to more or fewer than 1024 word lines, and bit line decoders BLD0, BLD1, BLD2 and BLD3 alternatively may be coupled to more or fewer than 1024 bit lines.

FIG. 4B1 depicts an example bit line numbering. To avoid overcrowding the drawings, only portions of bit lines are depicted and word line decoders WLD$\mathbf{0}_{S0}$, WLD$\mathbf{1}_{S0}$, WLD$\mathbf{0}_{S1}$ and WLD$\mathbf{1}_{S1}$ are omitted. FIG. 4B2 depicts an example word line numbering. To avoid overcrowding the drawings, only portions of word lines are depicted and bit line decoders BLD0, BLD1, BLD2 and BLD3 are omitted.

In an embodiment, word line hookup regions 402 are disposed parallel to the first axis (e.g., the x-axis) in the center of each word line decoder WLD$\mathbf{0}_{S0}$, WLD$\mathbf{1}_{S0}$, WLD$\mathbf{0}_{S1}$ and WLD$\mathbf{1}_{S1}$, and bit line hookup regions 404 are disposed parallel to the second axis (e.g., the y-axis) in the center of each bit line decoder BLD0, BLD1, BLD2 and BLD3, where the first axis is perpendicular to the second axis.

Referring to the embodiment of FIG. 4B1, bit lines 0, 1, 2, . . . , 1023 are coupled to bit line hookup region $\mathbf{404}_0$ in bit line decoder BLD0, bit lines 1024, 1025, . . . , 2047 are coupled to bit line hookup region $\mathbf{404}_1$ in bit line decoder BLD1, bit lines 2048, 2049, . . . , 3071 are coupled to bit line hookup region $\mathbf{404}_2$ in bit line decoder BLD2, and bit lines 3072, 3073, . . . , 4095 are coupled to bit line hookup region $\mathbf{404}_3$ in bit line decoder BLD3. Persons of ordinary skill in the art will understand that other bit line numbering arrangements are possible.

Referring to the embodiment of FIG. 4B2, word lines 0, 1, 2, . . . , 1023 are coupled to word line hookup region $\mathbf{402}_{00}$ in word line decoder WLD$\mathbf{0}_{S0}$, and word lines 1024, 1025, . . . , 2047 are coupled to word line hookup region $\mathbf{402}_{01}$ in word line decoder WLD$\mathbf{1}_{S0}$. In an embodiment, word lines 2048, 2049, . . . , 3071 are coupled to word line hookup region $\mathbf{402}_{10}$ in word line decoder WLD$\mathbf{0}_{S1}$, and word lines 3072, 3073, . . . , 4095 are coupled to word line hookup region $\mathbf{402}_{11}$ in word line decoder WLD$\mathbf{1}_{S1}$.

In an embodiment, word lines are disposed between two different levels (also referred to herein as "stories"). In an embodiment, word lines decoders WLD$\mathbf{0}_{S0}$ and WLD$\mathbf{1}_{S0}$ and word lines 0, 1, 2, . . . , 2047 are disposed in a first story (e.g., "Story 0" or "S0"), and word lines decoders WLD$\mathbf{0}_{S1}$ and WLD$\mathbf{1}_{S1}$ and word lines 2048, 2049, . . . , 4095 are disposed in a second story (e.g., "Story 1" or "S1") above Story 0.

For example, FIGS. 4C1-4C2 depict top and cross-sectional views of a portion of decoder module 400 of FIG. 4A. In particular, FIG. 4C1 depicts a top view of word line decoders WLD$\mathbf{0}_{S0}$ and WLD$\mathbf{0}_{S1}$ and bit line decoder BLD1. To avoid obscuring the drawing, only portions of word lines $WL_{01}$ and $WL_{11}$ and bit line $B_0$ are depicted. FIG. 4C2 depicts a cross-sectional view showing word line $WL_{01}$ disposed in Story 0, word line $WL_{11}$ disposed in Story 1, and bit line $B_0$ disposed between word lines $WL_{01}$ and $WL_{11}$.

In an embodiment, memory cells are disposed in Story 0 at an intersection between word line $WL_{01}$ and bit line $B_0$, and in Story 1 at an intersection between word line $WL_{11}$ and bit line $B_0$. In an embodiment, each memory cell includes a magnetic memory element $M_x$ coupled in series with a selector element $S_x$.

In particular, Story 0 includes a memory cell (including magnetic memory element $M_0$ coupled in series with selector element $S_0$) disposed between word line $WL_{01}$ and bit line $B_0$. Likewise, Story 1 includes a memory cell (including magnetic memory element $M_1$ coupled in series with selector element $S_1$) disposed between word line $WL_{11}$ and bit line $B_0$.

In an embodiment, word line decoder WLD$\mathbf{0}_{S0}$ is coupled to word line $WL_{01}$ via word line hookup region $\mathbf{402}_{00}$, word line decoder WLD$\mathbf{0}_{S1}$ is coupled to word line $WL_{11}$ via word line hookup region $\mathbf{402}_{10}$, and bit line decoder BLD1 is coupled to bit line $B_0$ via bit line hook up region $\mathbf{404}_1$. These connections are depicted as circular dots in FIG. 4C1.

In an embodiment, each word line hookup region (e.g., word line hookup region $\mathbf{402}_{00}$ and word line hookup region $\mathbf{402}_{10}$) includes a corresponding word line via 406 for each word line coupled to the word line hookup region. For example, word line hookup region $\mathbf{402}_{00}$ includes a word line via $\mathbf{406}_{01}$ that is coupled at a first end to word line $WL_{01}$ and is coupled at a second end to CMOS circuitry (depicted as "CMOS layer" in FIG. 4C2). In embodiments, CMOS circuitry may include current mirrors, sense amps, voltage clamps, level shifting logic, or other similar circuitry.

Similarly, word line hookup region 402$_{10}$ includes a word line via 406$_{11}$ that is coupled at a first end to word line $WL_{11}$ and is coupled at a second end to CMOS circuitry. Although not depicted in FIG. 4C2, each bit line hookup region (e.g., bit line hookup region 404$_1$) includes a corresponding bit line via for each bit line coupled to the bit line hookup region. Each bit line via is coupled at a first end to a bit line (e.g., bit line $B_0$) and is coupled at a second end to CMOS circuitry.

In an embodiment, decoder module 400 is coupled to $2\times N_{WL}$ word lines that are disposed along a first axis (e.g., an x-axis) on each of Story 0 and Story 1, and is coupled to $4\times N_{BL}$ bit lines that are disposed along a second axis (e.g., a y-axis). Thus, with $N_{WL}$=1024 and $N_{BL}$=1024, decoder module 400 of FIGS. 4B1-4B2 is coupled to 4096 bit lines and 4096 word lines.

Figure 4D:
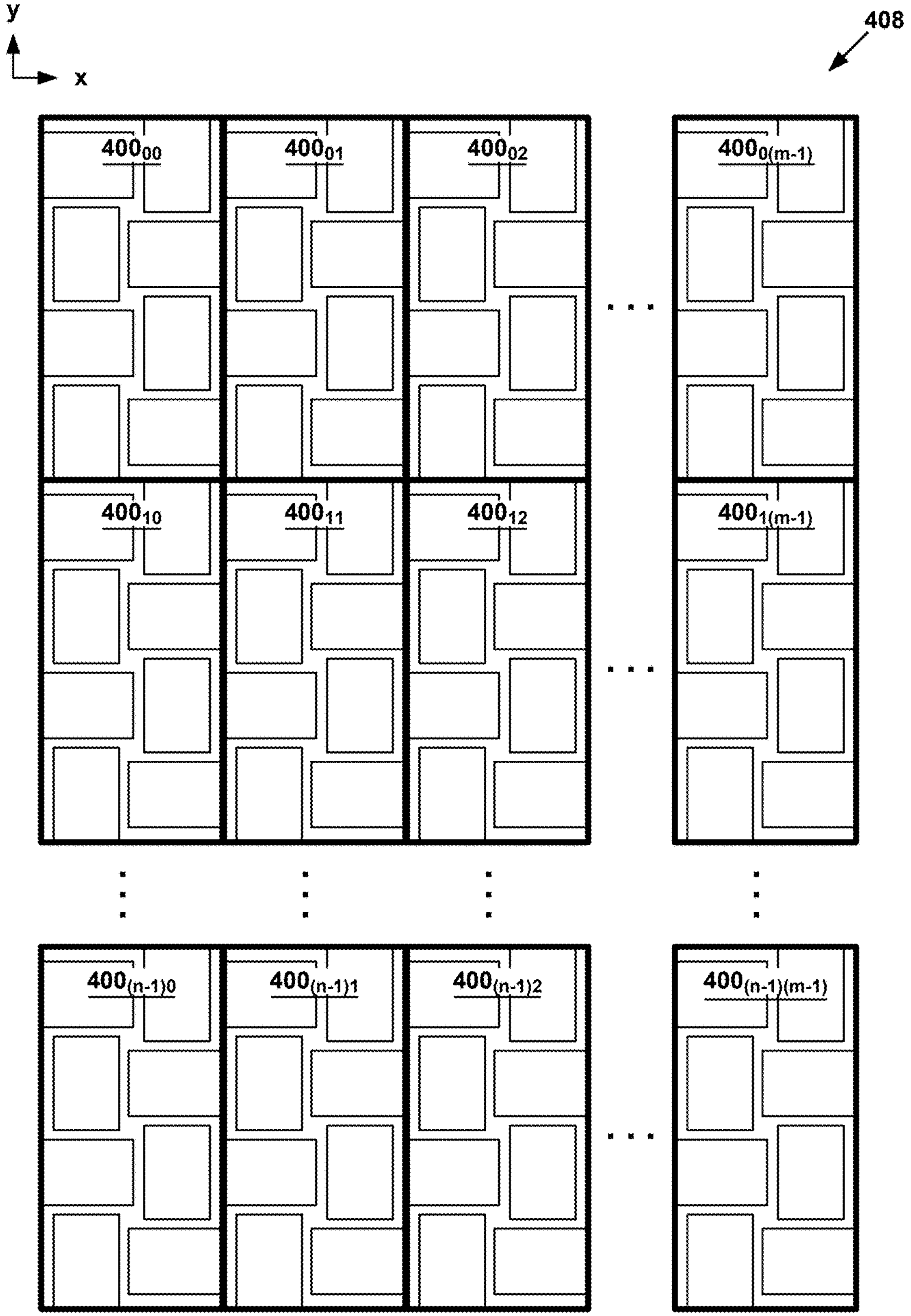
FIG. 4D depicts a diagram depicting an array of example decoder modules of FIGS. 4B1-4B2.

In an embodiment, multiple such decoder modules 400 may be used to address a larger number of memory cells. For example, FIG. 4D is a diagram depicting an array 408 of n rows and m columns of decoder modules 400$_{00}$, 400$_{01}$, 400$_{02}$, . . . , 400$_{(n-1)(m-1)}$, each a replica of decoder module 400 of FIGS. 4B1-4B2. To avoid overcrowding the drawing, word lines, bit lines, word line hookup regions and bit line hookup regions have been omitted.

Figure 5A:
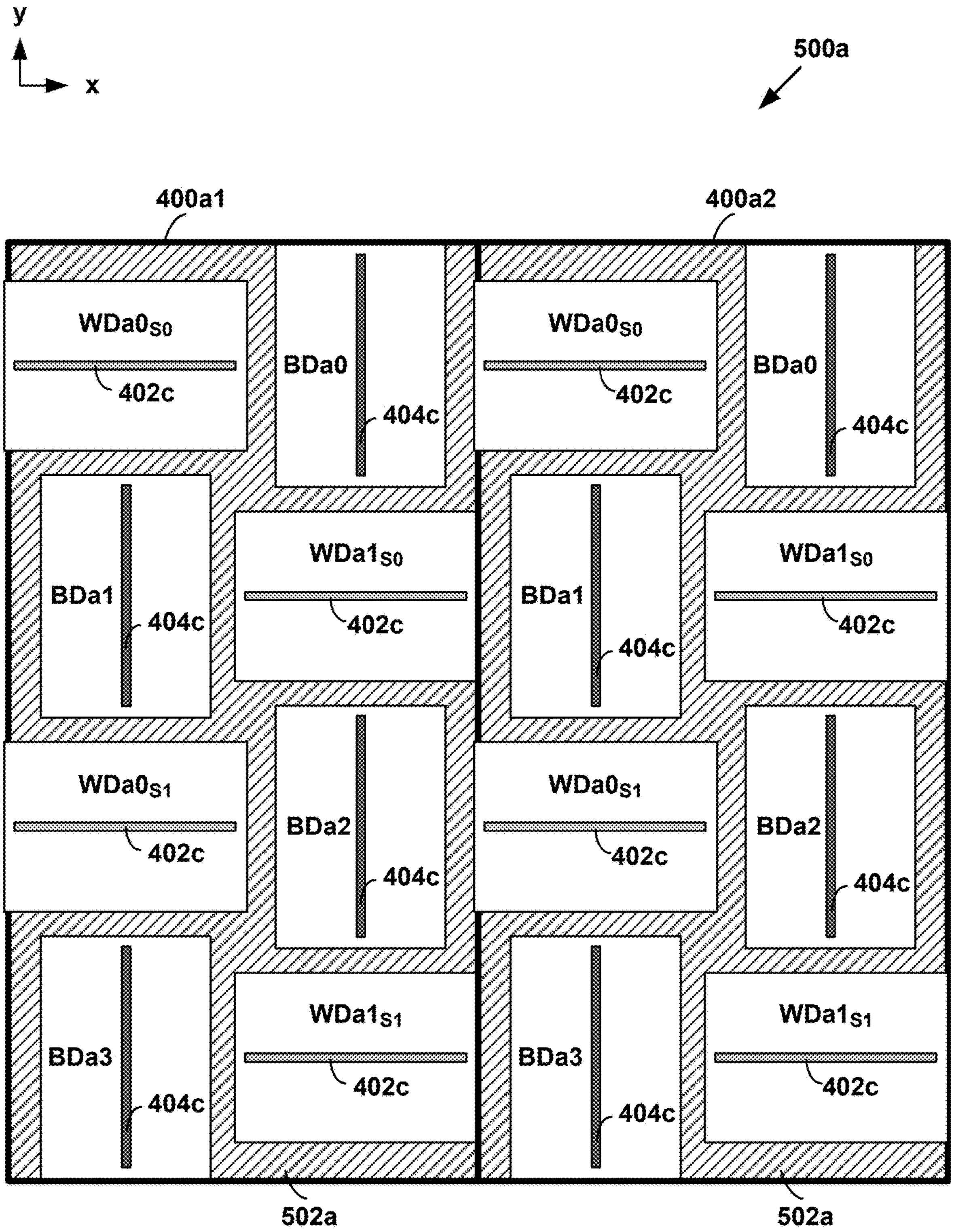
FIG. 5A depicts a first embodiment of a decoder module floorplan.

FIG. 5A depicts a first embodiment of a decoder module floorplan 500*a* that includes two adjacent decoder modules 400*a* and 400*b*, each of which is a replica of decoder module 400 of FIG. 4A. Decoder modules 400*a* and 400*b* each include four word line decoders WDa0$_{S0}$, WDa1$_{S0}$, WDa0$_{S1}$ and WDa1$_{S1}$ and four bit line decoders BDa0, BDa1, BDa2 and BDa3. In an embodiment, word line decoders WDa0$_{S0}$ and WDa1$_{S0}$ are disposed in Story 0, and word line decoders WDa0$_{S1}$ and WDa1$_{S1}$ and are disposed in Story 1.

In an embodiment, each of word line decoders WDa0$_{S0}$, WDa1$_{S0}$, WDa0$_{S1}$ and WDa1$_{S1}$ includes a "center pane" word line hookup region 402*c* and each of bit line decoders BDa0, BDa1, BDa2 and BDa3 includes a center pane bit line hookup region 404*c*. As used herein, a "center pane" hookup region is centrally disposed in a word line decoder/bit line decoder as depicted in FIG. 5A.

In an embodiment, each of word line decoders WDa0$_{S0}$, WDa1$_{S0}$, WDa0$_{S1}$ and WDa1$_{S1}$ is coupled to 1K (1024) corresponding word lines (not depicted) that each span 2K (2048) memory cells in each direction from the corresponding word line hookup region 402*c*. In an embodiment, each of bit line decoders BDa0, BDa1, BDa2 and BDa3 is coupled to 1K (1024) corresponding bit lines (not depicted) that each span 1K (1024) memory cells in each direction from the corresponding bit line hookup region 404*c*.

In memory technology, the concepts "near" and "far" are sometimes used to characterize a path resistance along a word line length and a bit line length to access a selected memory cell. In an embodiment, each memory cell has a corresponding path length from the memory cell to the corresponding word line hookup region and from the memory cell to the corresponding bit line hookup region.

In an embodiment, a "near-near" memory cell has a relatively low path length by virtue of the memory cell being near the corresponding word line hookup region and near the corresponding bit line hookup region.

In an embodiment, a "far-far" memory cell has a relatively high path length by virtue of the memory cell being far from the corresponding word line hookup region and far from the corresponding bit line hookup region.

In the example depicted in FIG. 5A, a "near-near" memory cell may be characterized as a memory cell for which a combined word line and bit line distance from the corresponding word line hookup region and bit line hookup region, respectively, is 0.5K (e.g., 512 cells), and a "far-far" memory cell may be characterized as a memory cell for which a combined word line and bit line distance from the corresponding word line hookup region and bit line hookup region, respectively, is 3K (e.g., 3072 memory cells). In an embodiment, a difference between a non-volatile memory cell having a longest path length (e.g., a "far-far" memory cell) and a shortest path length (e.g., a "near-near" memory cell) for the embodiment of FIG. 5A is thus 3K–0.5K=2.5K.

In an embodiment, decoder modules 400*a*1 and 400*a*2 include regions 502*a* (shown in cross-hatch shading) surrounding and separating word line decoders WDa0$_{S0}$, WDa1$_{S0}$, WDa0$_{S1}$ and WDa1$_{S1}$ and bit line decoders BDa0, BDa1, BDa2 and BDa3 from one another. In the embodiment of FIG. 5A, each of word line decoders WDa0$_{S0}$, WDa1$_{S0}$, WDa0$_{S1}$ and WDa1$_{S1}$ and bit line decoders BDa0, BDa1, BDa2 and BDa3 are surrounded on all sides by regions 502*a*. That is, word line decoders WDa0$_{S0}$, WDa1$_{S0}$, WDa0$_{S1}$ and WDa1$_{S1}$ and bit line decoders BDa0, BDa1, BDa2 and BDa3 do not abut one another and are akin to islands separated from one another by regions 502*a*. In an embodiment, regions 502*a* constitute approximately 20% of the area of each decoder module 400*a*1 and 400*a*2.

In embodiments, numerous circuits (e.g., current mirrors, voltage clamps, sense amps, level shifting logic, etc.) are used to perform various operations on the word lines and bit lines that are coupled to the word line and bit line decoders in the decoder module. These numerous circuits are collectively referred to herein as "Local Circuits." In an embodiment, the Local Circuits comprise CMOS circuits.

In an embodiment, the Local Circuits are disposed within region 502*a*. Indeed, in embodiments the floorplan of a module is typically determined by first specifying the location of word line decoders WDa0$_{S0}$, WDa1$_{S0}$, WDa0$_{S1}$ and WDa1$_{S1}$ and bit line decoders BDa0, BDa1, BDa2 and BDa3, and then fitting the Local Circuits in regions 502*a*. In many instances, the available space in regions 502*a* is quite limited, and thus fitting the Local Circuits in regions 502*a* is difficult.

The example floorplan 500*a* of FIG. 5A is just one example floorplan. Other floorplan embodiments also may be used, and each floorplan has various advantages and disadvantages in terms of overall decoder size (and therefore die size) and available space for locating the Local Circuits. In embodiments, floorplan design and selection depends on various criteria that must be satisfied.

Figure 5B:
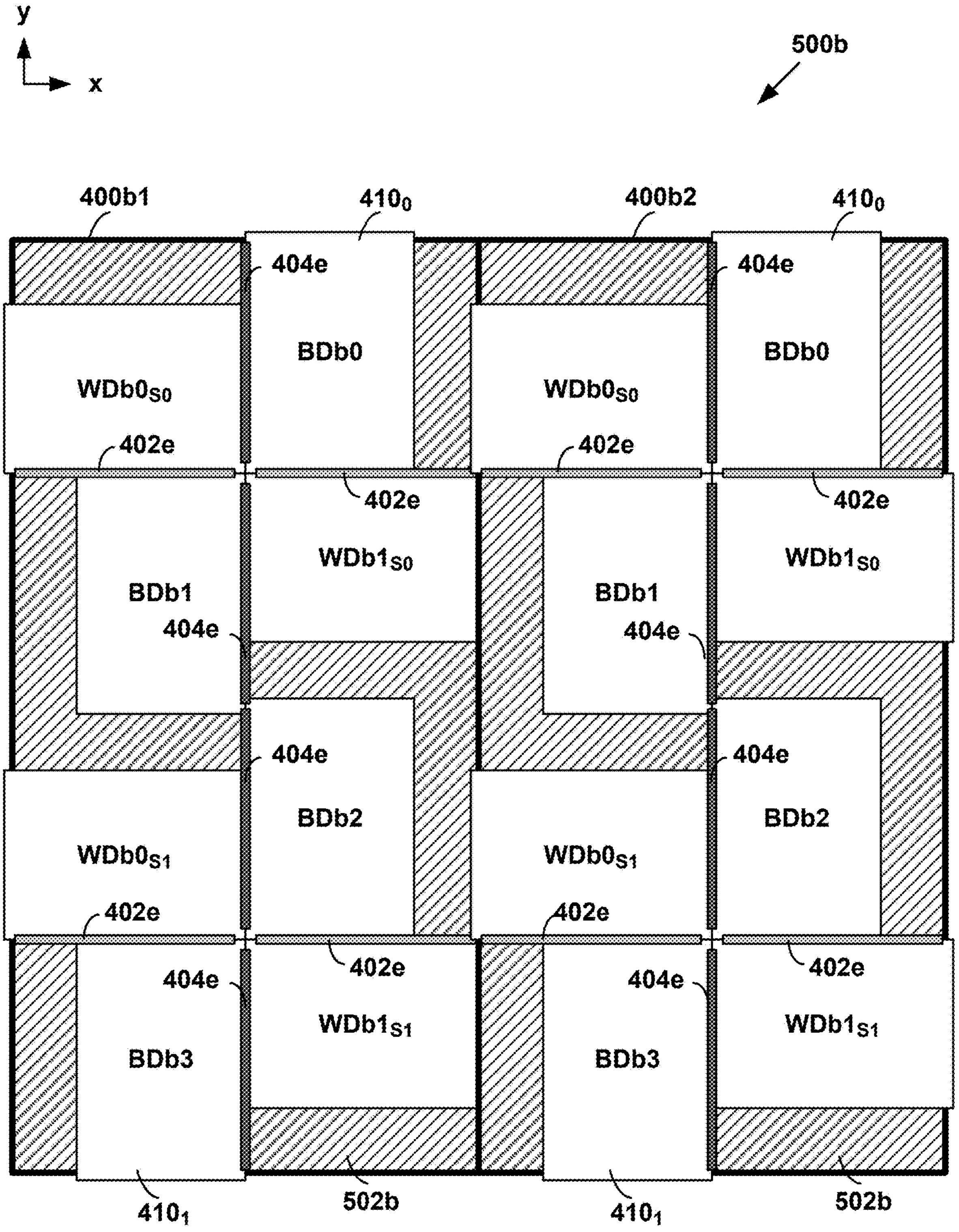
FIG. 5B depicts a second embodiment of a decoder module floorplan.

FIG. 5B depicts a second embodiment of a decoder module floorplan 500*b* that includes two adjacent decoder modules 400*b*1 and 400*b*2. Decoder modules 400*b*1 and 400*b*2 each include four word line decoders WDb0$_{S0}$, WDb1$_{S0}$, WDb0$_{S1}$ and WDb1$_{S1}$ and four bit line decoders BDb0, BDb1, BDb2 and BDb3. In an embodiment, word line decoders WDb0$_{S0}$ and WDb1$_{S0}$ are disposed in Story 0, and word line decoders WDb0$_{S1}$ and WDb1$_{S1}$ and are disposed in Story 1.

In an embodiment, each of word line decoders WDb0$_{S0}$, WDb1$_{S0}$, WDb0$_{S1}$ and WDb1$_{S1}$ includes an "edge pane" word line hookup region 402*e* and each of bit line decoders BDb0, BDb1, BDb2 and BDb3 includes an edge pane bit line hookup region 404*e*. As used herein, an "edge pane" hookup region is disposed along an edge of a word line decoder/bit line decoder as depicted in FIG. 5B.

In an embodiment, each of decoder modules **400*b*1 and 400*b*2 includes two clusters of abutting word line decoders and bit line decoders. In particular, a first decoder cluster $\mathbf{410}_0$ includes word line decoders WDb$\mathbf{0}_{S0}$ and WDb$\mathbf{1}_{S0}$ and bit line decoders BDb0 and BDb1, and a second decoder cluster $\mathbf{410}_1$ includes word line decoders WDb$\mathbf{0}_{S1}$ and WDb$\mathbf{1}_{S1}$ and bit line decoders BDb2 and BDb3**.

In an embodiment, word line decoders WDb$\mathbf{0}_{S0}$ and WDb$\mathbf{1}_{S0}$ and bit line decoders BDb0 and BDb1 in first decoder cluster $\mathbf{410}_0$ abut one another. In an embodiment, word line decoders WDb$\mathbf{0}_{S1}$ and WDb$\mathbf{1}_{S1}$ and bit line decoders BDb2 and BDb3 in second decoder cluster $\mathbf{410}_1$ abut one another.

In an embodiment, each of decoder modules **400*b*1 and 400*b*2 includes bit line hookup regions 404*e* that are disposed along a common axis. In an embodiment, the first decoder cluster $\mathbf{410}_0$ of each of decoder modules 400*b*1 and 400*b*2 includes word line hookup regions 402*e* that are disposed along a first axis and the second decoder cluster $\mathbf{410}_1$ of each of decoder modules 400*b*1 and 400*b*2 includes word line hookup regions 402*e*** that are disposed along a second axis.

In an embodiment, each of word line decoders WDb$\mathbf{0}_{S0}$, WDb$\mathbf{1}_{S0}$, WDb$\mathbf{0}_{S1}$ and WDb$\mathbf{1}_{S1}$ is coupled to 1K (1024) corresponding word lines (not depicted) that each span 2K (2048) memory cells in each direction from the corresponding word line hookup region **402*e*, and each of bit line decoders BDb0, BDb1, BDb2 and BDb3 is coupled to 1K (1024) corresponding bit lines (not depicted) that span 1K (1024) memory cells in each direction from the corresponding bit line hookup region 404*e***.

In the example depicted in FIG. 5B, a "near-near" memory cell may be characterized as a memory cell for which a combined word line and bit line distance is 0 (e.g., 0 cells), and a "far-far" memory cell may be characterized as a memory cell for which a combined word line and bit line distance is 3K (e.g., 3072 memory cells). In an embodiment, a difference between a non-volatile memory cell having a longest path length (e.g., a "far-far" memory cell) and a shortest path length (e.g., a "near-near" memory cell) for the embodiment of FIG. 5B is thus 3K−0K=3K.

In an embodiment, decoder modules **400*b*1 and 400*b*2 include regions 502*b* (shown in cross-hatch shading) surrounding and separating first decoder cluster $\mathbf{410}_0$ and second decoder cluster $\mathbf{410}_1$ from one another. In an embodiment, regions 502*b* constitute approximately 16% of the area of each decoder module 400*b*1 and 400*b*2**.

Regions **502*b* have a slightly smaller overall percentage of area than regions 502*a* of FIG. 5A, but have larger aspect ratios and improved continuity. As a result, without wanting to be bound by any particular theory, it is believed that example floorplan 500*b* of FIG. 5B may permit a less constrained layout of Local Circuits than region 502*a* of floorplan 500*a***.

In this regard, without wanting to be bound by any particular theory, it is believed that region **502*b* may more easily accommodate the Local Circuits than region 502*a*. Thus, for some implementations, example floorplan 500*b* of FIG. 5B may be more advantageous than floorplan 500*a* of FIG. 5A. However, the far-far/near-near difference of floorplan 500*b* (3K) is greater than that of floorplan 500*a*** (2.5K), so these factors may be weighed against one another when determining a floorplan for a particular application.

Figure 5C:
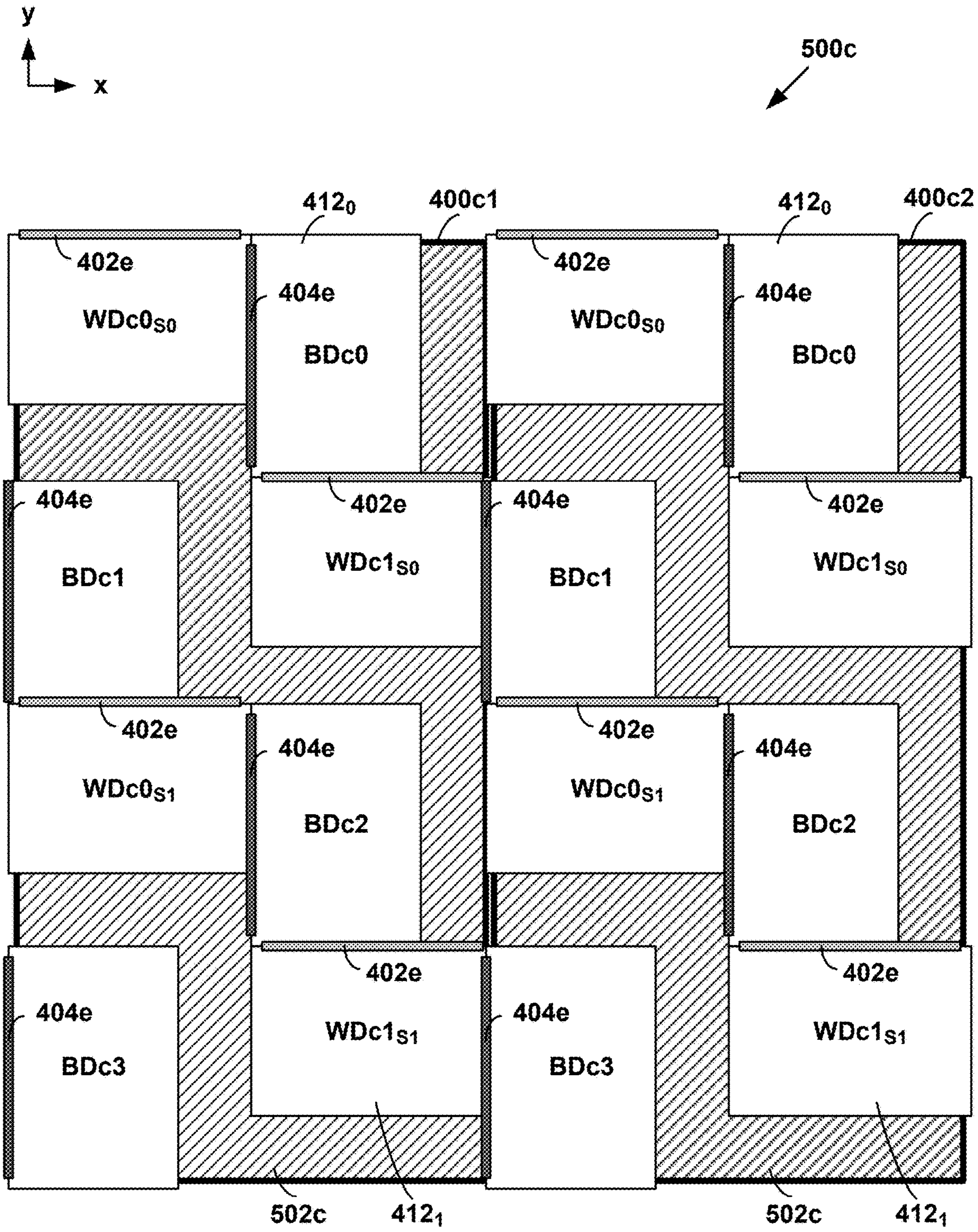
FIG. 5C depicts a third embodiment of a decoder module floorplan.

FIG. 5C depicts a third embodiment of a decoder module floorplan **500*c* that includes two adjacent decoder modules 400*c*1 and 400*c*2. Decoder modules 400*c*1 and 400*c*2 each include four word line decoders WDc$\mathbf{0}_{S0}$, WDc$\mathbf{1}_{S0}$, WDc$\mathbf{0}_{S1}$ and WDc$\mathbf{1}_{S1}$ and four bit line decoders BDc0, BDc1, BDc2 and BDc3**. In an embodiment, word line decoders WDc$\mathbf{0}_{S0}$ and WDc$\mathbf{1}_{S0}$ are disposed in Story 0, and word line decoders WDb$\mathbf{0}_{S1}$ and WDb$\mathbf{1}_{S1}$ and are disposed in Story 1.

In an embodiment, each of word line decoders WDc$\mathbf{0}_{S0}$, WDc$\mathbf{1}_{S0}$, WDc$\mathbf{0}_{S1}$ and WDc$\mathbf{1}_{S1}$ includes an edge pane word line hookup region **402*e* and each of bit line decoders BDc0, BDc1, BDc2 and BDc3 includes an edge pane bit line hookup region 404*e***.

In an embodiment, word line hookup regions **402*e* and bit line hookup regions 404*e* are disposed end-to-end substantially orthogonal to one another. In an embodiment, word line hookup regions 402*e* and bit line hookup regions 404*e*** are disposed end-to-end in a diagonal zig-zag pattern.

In an embodiment, each of decoder modules **400*c*1 and 400*c*2 includes two clusters of abutting word line decoders and bit line decoders. In particular, a first decoder cluster $\mathbf{412}_0$ includes word line decoders WDc$\mathbf{0}_{S0}$ and WDc$\mathbf{1}_{S0}$ and bit line decoder BDc0, and a second decoder cluster $\mathbf{412}_1$ includes word line decoders WDc$\mathbf{0}_{S1}$ and WDc$\mathbf{1}_{S1}$ and bit line decoders BDc1 and BDc2**.

In an embodiment, bit line decoder BDc3 forms part of the first cluster $\mathbf{412}_0$ of the adjacent decoder module **400*c* below the present decoder module 400*c*. In an embodiment, the first decoder cluster $\mathbf{412}_0$ of decoder module 400*c*1 abuts and/or is coupled to the second decoder cluster $\mathbf{412}_1$ of adjacent decoder module 400*c*2**.

In an embodiment, word line decoders WDc$\mathbf{0}_{S0}$ and WDc$\mathbf{1}_{S0}$ and bit line decoder BDc0 in first decoder cluster $\mathbf{412}_0$ abut one another. In an embodiment, word line decoders WDc$\mathbf{0}_{S1}$ and WDc$\mathbf{1}_{S1}$ and bit line decoders BDc1 and BDc2 in second decoder cluster $\mathbf{412}_1$ abut one another.

In an embodiment, each of word line decoders WDc$\mathbf{0}_{S0}$, WDc$\mathbf{1}_{S0}$, WDc$\mathbf{0}_{S1}$ and WDc$\mathbf{1}_{S1}$ is coupled to 1K (1024) corresponding word lines (not depicted) that each span 2K (2048) memory cells in each direction from the corresponding word line hookup region **402*e*, and each of bit line decoders BDc0, BDc1, BDc2 and BDc3 is coupled to 1K (1024) corresponding bit lines (not depicted) that span 1K (1024) memory cells in each direction from the corresponding bit line hookup region 404*e***.

In the example depicted in FIG. 5C, a "near-near" memory cell may be characterized as a memory cell for which a combined word line and bit line distance is 0 (e.g., 0 cells), and a "far-far" memory cell may be characterized as a memory cell for which a combined word line and bit line distance is 3K (e.g., 3072 memory cells). In an embodiment, a difference between a non-volatile memory cell having a longest path length (e.g., a "far-far" memory cell) and a shortest path length (e.g., a "near-near" memory cell) for the embodiment of FIG. 5C is thus 3K−0K=3K.

In an embodiment, decoder modules **400*c*1 and 400*c*2 include regions 502*c* (shown in cross-hatch shading) surrounding and separating first decoder cluster $\mathbf{412}_0$ and second decoder cluster $\mathbf{412}_1$ from one another. In an embodiment, regions 502*c* constitute approximately 16% of the area of each decoder module 400*c*1 and 400*c*2**.

Regions **502*c* have a slightly smaller overall percentage of area than regions 502*a* of FIG. 5A, but have more continuous area. As a result, without wanting to be bound by any particular theory, it is believed that example floorplan 500*c* of FIG. 5C may permit an even less constrained layout of Local Circuits than region 502*a* of floorplan 500*a***.

In this regard, without wanting to be bound by any particular theory, it is believed that region **502*c* may even more easily accommodate the Local Circuits than region 502*a*, and may allow inclusion of additional circuits for additional functionality. Thus, for some implementations, example floorplan 500***c* of FIG. 5C may be more advantageous than floorplan 500*a* of FIG. 5A. However, the far-far/near-near difference of floorplan 500*c* (3K) is greater than that of floorplan 500*a* (2.5K), so these factors may be weighed against one another when determining a floorplan for a particular application.

Figure 5D:
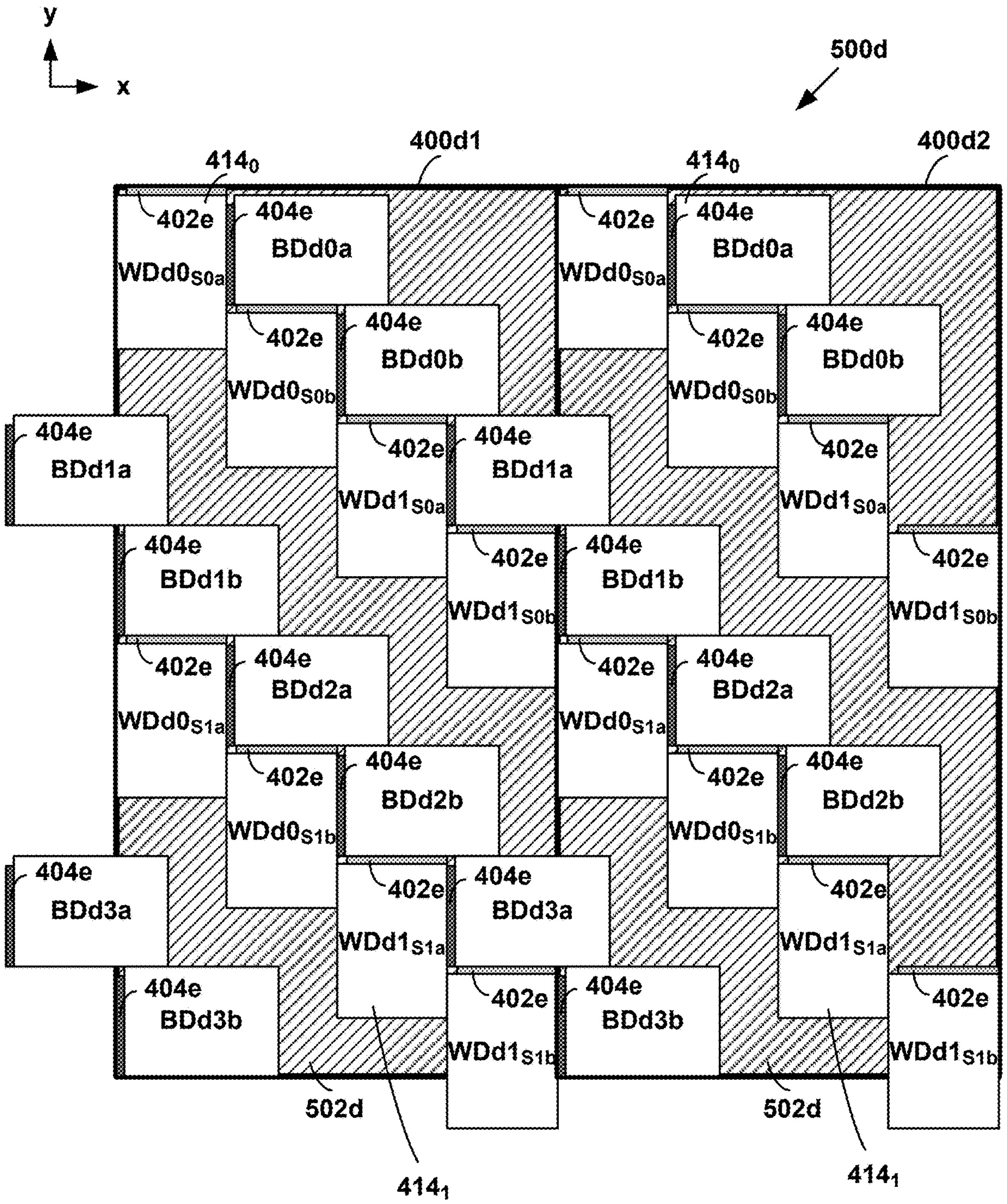
FIG. 5D depicts a fourth embodiment of a decoder module floorplan.

FIG. 5D depicts a fourth embodiment of a decoder module floorplan 500*d* that includes two adjacent decoder modules 400*d*1 and 400*d*2. Decoder modules 400*d*1 and 400*d*2 each include eight word line decoders WDd0$_{S0a}$, WDd0$_{S0b}$, WDd1$_{S0a}$, WDd1$_{S0b}$, WDd0$_{S1a}$, WDd0$_{S1b}$, WDd1$_{S1a}$ and WDd1$_{S1b}$, and eight bit line decoders BDd0*a*, BDd0*b*, BDd1*a*, BDd1*b*, BDd2*a*, BDd2*b*, BDd3*a* and BDd3*b*. In an embodiment, word line decoders WDd0$_{S0a}$, WDd0$_{S0b}$, WDd1$_{S0a}$, WDd1$_{S0b}$ are disposed in Story 0, and word line decoders WDd0$_{S1a}$, WDd0$_{S1b}$, WDd1$_{S1a}$ and WDd1$_{S1b}$ and are disposed in Story 1.

In an embodiment, each of word line decoders WDd0$_{S0a}$, WDd0$_{S0b}$, WDd1$_{S0a}$, WDd1$_{S0b}$, WDd0$_{S1a}$, WDd0$_{S1b}$, WDd1$_{S1a}$ and WDd1$_{S1b}$ includes an edge pane word line hookup region 402*e* and each of bit line decoders BDd0*a*, BDd0*b*, BDd1*a*, BDd1*b*, BDd2*a*, BDd2*b*, BDd3*a* and BDd3*b* includes an edge pane bit line hookup region 404*e*.

In an embodiment, word line hookup regions 402*e* and bit line hookup regions 404*e* are disposed end-to-end substantially orthogonal to one another. In an embodiment, word line hookup regions 402*e* and bit line hookup regions 404*e* are disposed end-to-end in a diagonal zig-zag pattern.

In an embodiment, each of decoder modules 400*d*1 and 400*d*2 includes two clusters of abutting word line decoders and bit line decoders. In particular, a first decoder cluster 414$_0$ includes word line decoders WDd0$_{S0a}$, WDd0$_{S0b}$, WDd1$_{S0a}$, and WDd1$_{S0b}$, and bit line decoders BDd0*a* and BDd0*b*, and a second decoder cluster 414$_1$ includes word line decoders WDd0$_{S1a}$, WDd0$_{S1b}$, WDd1$_{S1a}$, and WDd1$_{S1b}$, and bit line decoders BDd1*a*, BDd1*b*, BDd2*a* and BDd2*b*.

In an embodiment, bit line decoders BDd3*a* and BDd3*b* form part of the first cluster 414$_0$ of the adjacent decoder module 400*d* below the present decoder module 400*c*. In an embodiment, the first decoder cluster 414$_0$ of decoder module 400*d*1 abuts and/or is coupled to the second decoder cluster 414$_1$ of adjacent decoder module 400*d*2.

In an embodiment, word line decoders WDd0$_{S0a}$, WDd0$_{S0b}$, WDd1$_{S0a}$, and WDd1$_{S0b}$ and bit line decoders BDd0*a* and BDd0*b* in first decoder cluster 414$_0$ abut one another. In an embodiment, word line decoders WDd0$_{S1a}$, WDd0$_{S1b}$, WDd1$_{S1a}$, and WDd1$_{S1b}$ and bit line decoders BDd1*a* BDd1*b*, BDd2*a* and BDd2*b* in second decoder cluster 414$_1$ abut one another.

In an embodiment, each of word line decoders WDd0$_{S0a}$, WDd0$_{S0b}$, WDd1$_{S0a}$, WDd1$_{S0b}$, WDd0$_{S1a}$, WDd0$_{S1b}$, WDd1$_{S1a}$ and WDd1$_{S1b}$ is coupled to 0.5K (512) corresponding word lines (not depicted) that each span 1K (1024) memory cells in each direction from the corresponding word line hookup region 402*e*, and each of bit line decoders BDd0*a*, BDd0*b*, BDd1*a*, BDd1*b*, BDd2*a*, BDd2*b*, BDd3*a* and BDd3*b* is coupled to 0.5K (512) corresponding bit lines (not depicted) that span 0.5K (512) memory cells in each direction from the corresponding bit line hookup region 404*e*.

In the example depicted in FIG. 5D, a "near-near" memory cell may be characterized as a memory cell for which a combined word line and bit line distance is 0 (e.g., 0 cells), and a "far-far" memory cell may be characterized as a memory cell for which a combined word line and bit line distance is 2.5K (e.g., 2560 memory cells). In an embodiment, a difference between a non-volatile memory cell having a longest path length (e.g., a "far-far" memory cell) and a shortest path length (e.g., a "near-near" memory cell) for the embodiment of FIG. 5D is thus 2.5K−0K=2.5K.

In an embodiment, decoder modules 400*d*1 and 400*d*2 include regions 502*d* (shown in cross-hatch shading) surrounding and separating first decoder cluster 414$_0$ and second decoder cluster 414$_1$ from one another. In an embodiment, regions 502*d* constitute approximately 26% of the area of each decoder module 400*d*1 and 400*d*2.

In an embodiment, each of decoder modules 400*d*1 and 400*d*2 includes a first set of word line decoders WDd0$_{S0a}$, WDd0$_{S0b}$, WDd1$_{S0a}$ that abuts a first set of bit line decoders BDd0*a* and BDd0*b*, and a second set of word line decoders WDd0$_{S1a}$, WDd0$_{S1b}$, WDd1$_{S1a}$ that abuts a set of bit line decoders BDd1*b*, BDd2*a* and BDd2*b*. In an embodiment, regions 502*a* separate the first set of word line decoders from the second set of bit line decoders.

Regions 502*d* have a larger percentage of area than regions 502*a* of FIG. 5A, and have more continuous area. As a result, without wanting to be bound by any particular theory, it is believed that example floorplan 500*d* of FIG. 5D may permit an even less constrained layout of Local Circuits than region 502*a* of floorplan 500*a*.

In this regard, without wanting to be bound by any particular theory, it is believed that region 502*d* may even more easily accommodate the Local Circuits than region 502*a*, and may allow inclusion of additional circuits for additional functionality. Thus, for some implementations, example floorplan 500*d* of FIG. 5D may be more advantageous than floorplan 500*a* of FIG. 5A.

Because each word line decoder and each bit line decoder drives 0.5K lines, floorplan 500*d* reduces the distance to the farthest cell from 3K to 2.5K cells. Without wanting to be bound by any particular theory, this may permit the use of reduced voltage supplies (reduced energy per bit) and/or improved current delivery to the cell.

Without wanting to be bound by any particular theory, it is believed that example floorplan 500*d* of FIG. 5D includes larger continuous area (like example floorplan 500*c* of FIG. 5C), but also reduces the difference between far-far and near-near path lengths. Floorplan 500*d* does, however, require twice the number of hookup regions as in floorplans 500*a*, 500*b* and 500*c*. This is another factor to be considered when selecting a floorplan for a particular application.

FIGS. 5E-5H depict condensed views of example floorplans 500*a*, 500*b*, 500*c* and 500*d* of FIGS. 5A-5D, respectively. FIGS. 5E-5H thus provide a macro view of device that uses each of the various example floorplans described above.

Figure 5E:
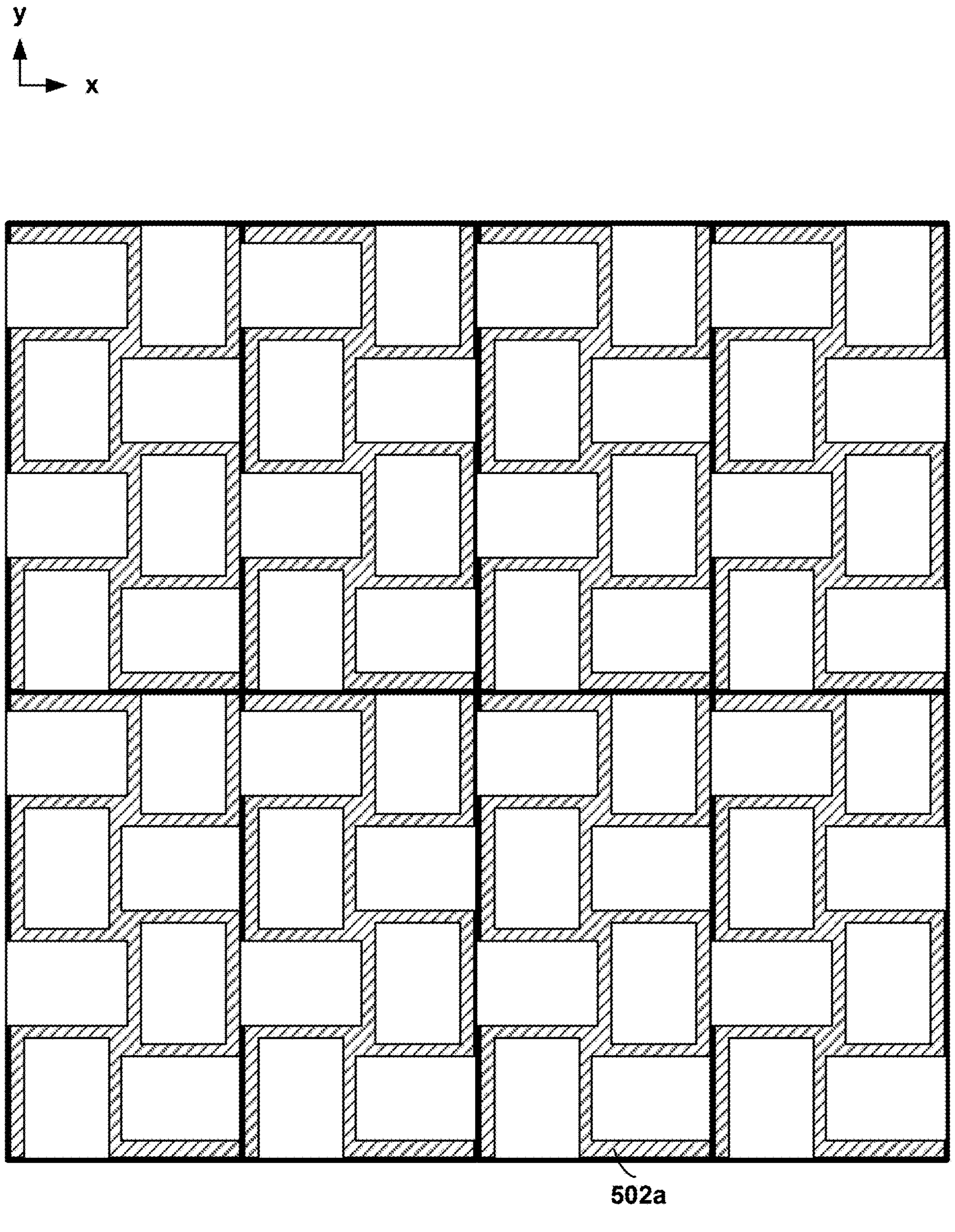
FIGS. 5E-5H depict condensed views of the example floorplans of FIGS. 5A-5D, respectively.
Figure 5F:
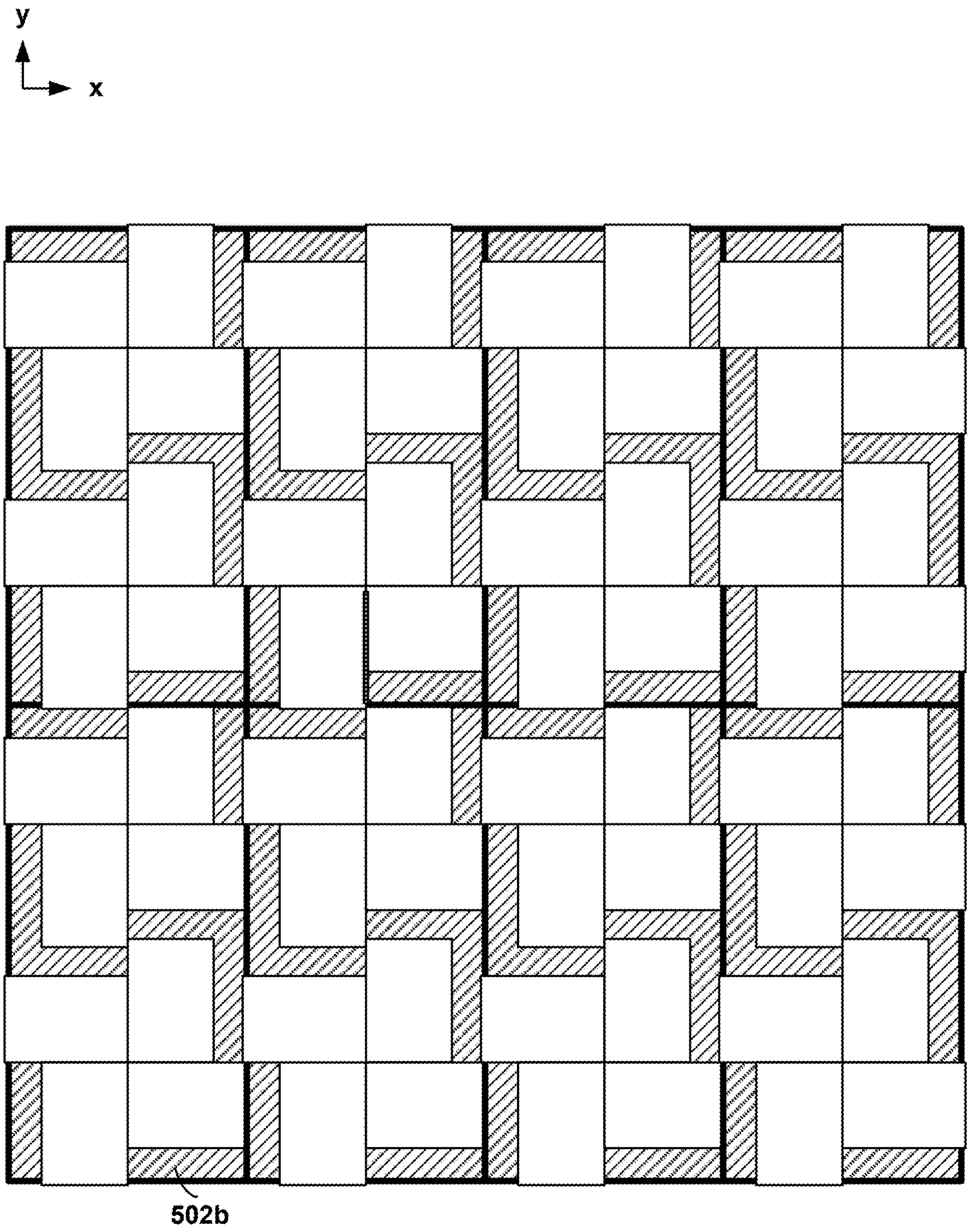
Figure 5G:
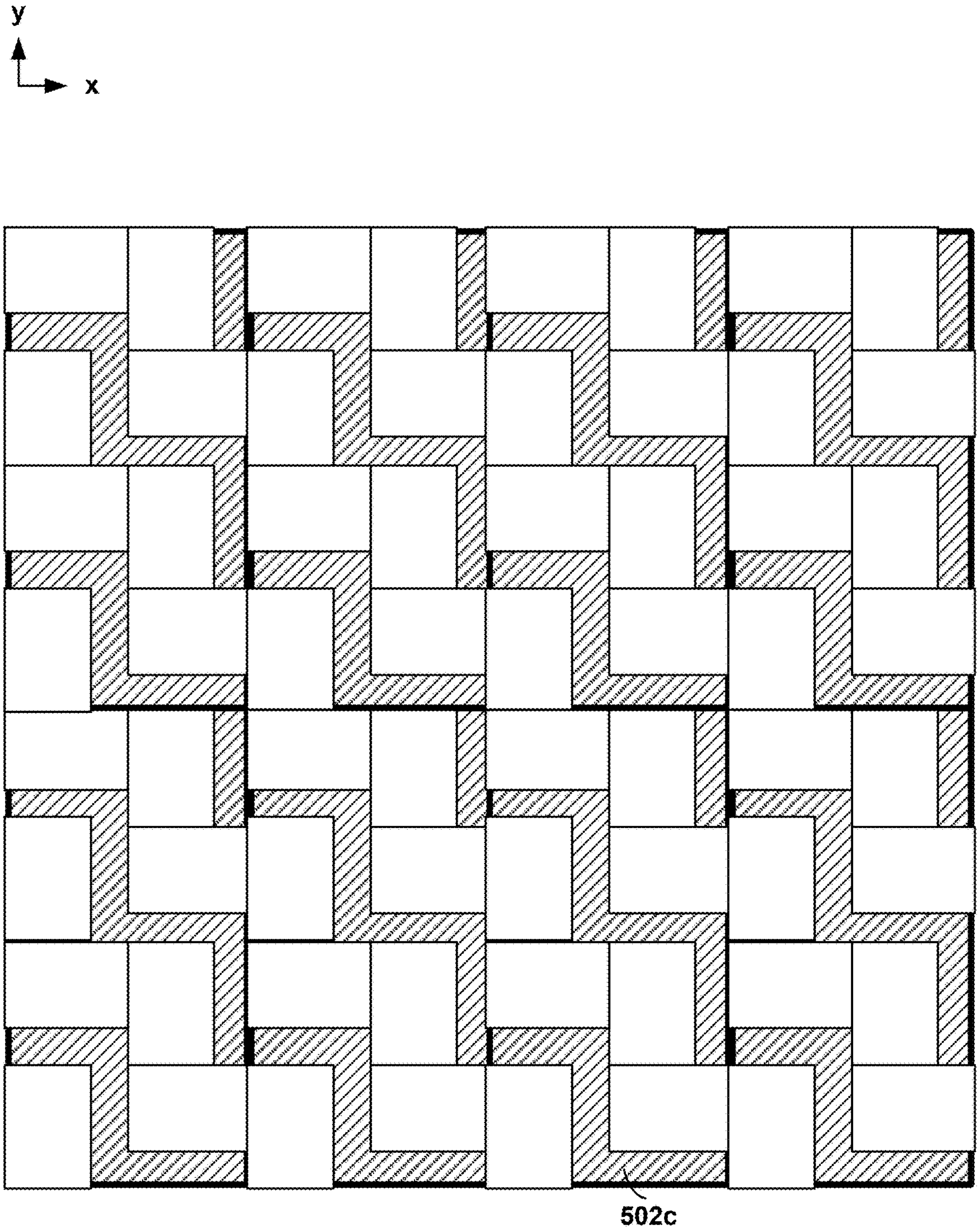
Figure 5H:
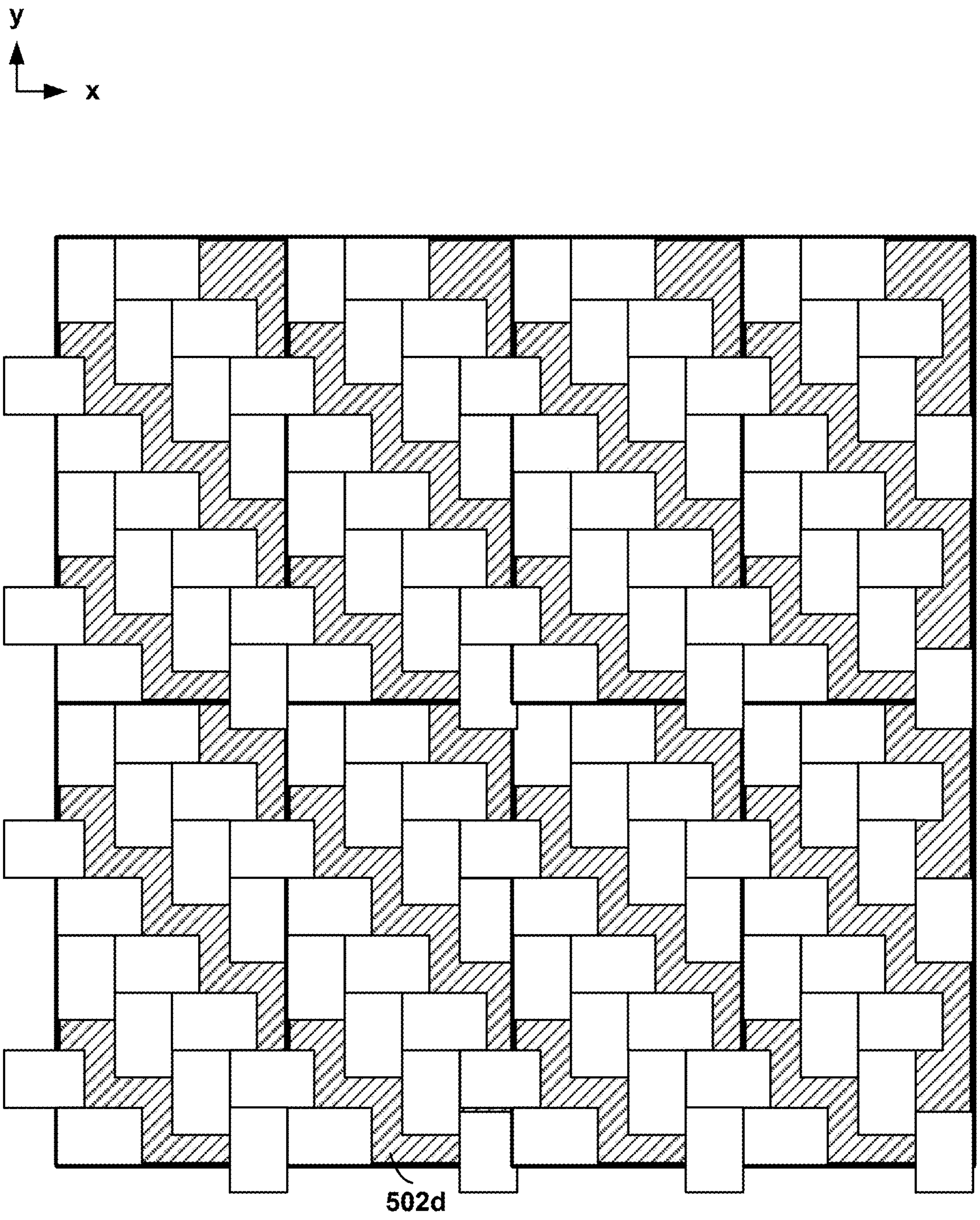

As can be seen in FIG. 5E (floorplan 500*a*), the word line decoders and bit line decoders are separated from one another, and region 502*a* is a bit disjointed. In FIG. 5F (floorplan 500*b*), the word line decoders and bit line decoders abut one another in a pinwheel pattern, and region 502*b* provides more continuous space than region 502*a*. In FIG. 5G (floorplan 500*c*), the word line decoders and bit line decoders abut one another in zig-zag pattern, and region 502*c* provides a larger continuous area than region 502*a*. In FIG. 5H (floorplan 500*d*), the word line decoders and bit line decoders abut one another in chevron pattern, and region 502*d* provides an even larger continuous area than region 502*a*.

Figure 6:
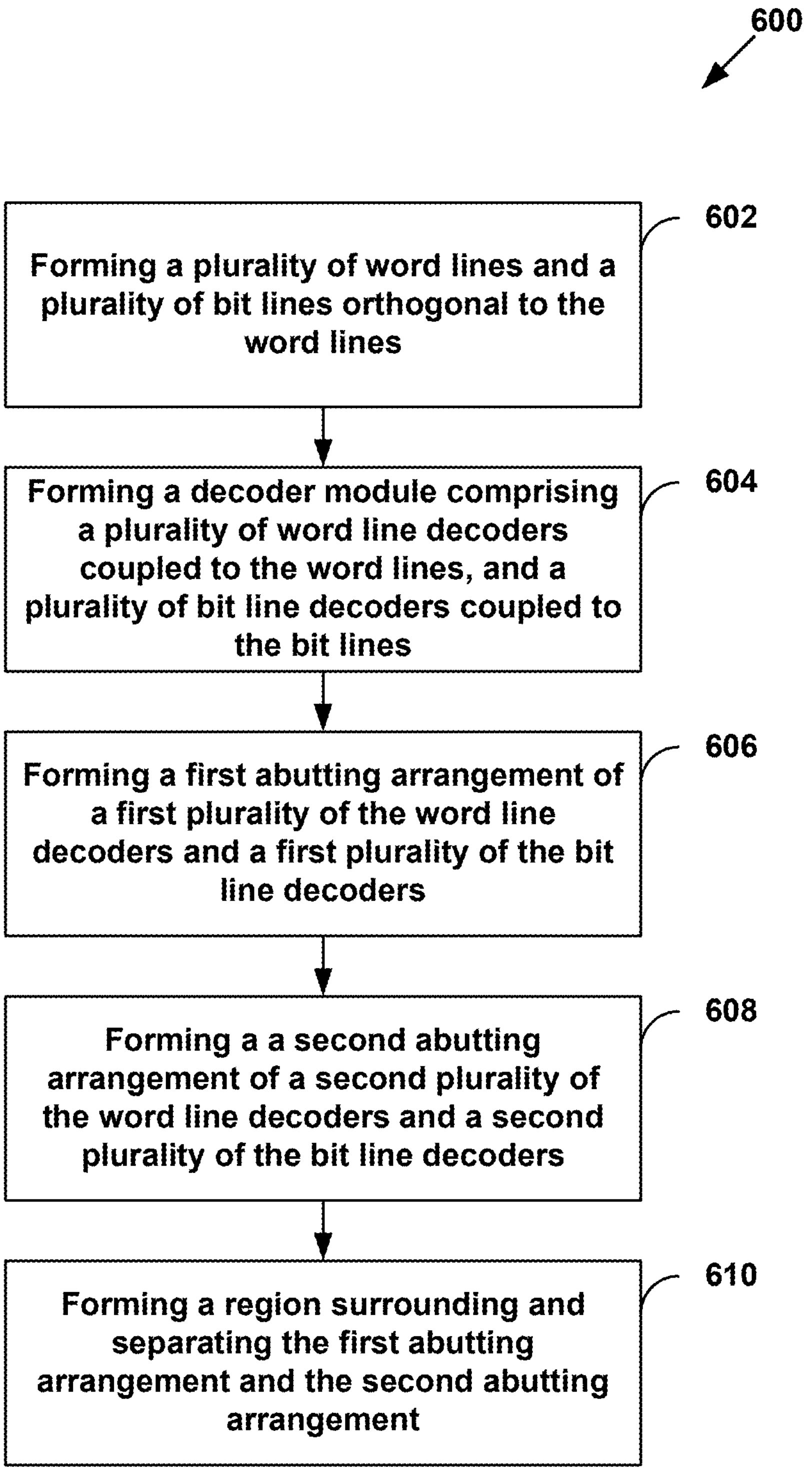
FIG. 6 is a block diagram of an embodiment of a method 600 of forming a non-volatile memory.

FIG. 6 is a block diagram of an embodiment of a method 600 of forming a non-volatile memory.

At step 602, forming a plurality of word lines and a plurality of bit lines orthogonal to the word lines.

At step 604, forming a decoder module including a plurality of word line decoders coupled to the word lines, and a plurality of bit line decoders coupled to the bit lines.

At step 606, forming a first abutting arrangement of a first plurality of the word line decoders and a first plurality of the bit line decoders.

At step 608, forming a second abutting arrangement of a second plurality of the word line decoders and a second plurality of the bit line decoders.

At step 610, forming a region surrounding and separating the first abutting arrangement and the second abutting arrangement.

In embodiments, the first abutting arrangement and the second abutting arrangement are formed to maximize an amount of continuous space in the region.

One embodiment of the disclosed technology includes a non-volatile memory that includes a memory array including non-volatile memory cells and a first decoder module coupled to the memory array. The first decoder module includes word line decoders coupled to the non-volatile memory cells, bit line decoders coupled to the non-volatile memory cells, a first cluster including a first set of the word line decoders and the bit line decoders, a second cluster including a second set of the word line decoders and the bit line decoders, and a region surrounding and separating the first cluster and the second cluster. The first set of the word line decoders and the bit line decoders abut one another and the second set of the word line decoders and the bit line decoders abut one another.

One embodiment of the disclosed technology includes a non-volatile memory including a memory array and a decoder module coupled to the memory array. The decoder module includes word line decoders each having a word line hookup region coupled to a corresponding set of N word lines, bit line decoders each having a bit line hookup region coupled to a corresponding set of N bit lines, a first set of the word line decoders abutting a first set of the bit line decoders, a second set of the word line decoders abutting a second set of the bit line decoders, and a region separating the first set of the word line decoders from the second set of the bit line decoders. The region is configured to accommodate one of more of a current mirror, a voltage clamp, a sense amplifier, and level shifting logic.

One embodiment of the disclosed technology includes a method that includes forming a plurality of word lines and a plurality of bit lines orthogonal to the word lines, forming a decoder module including a plurality of word line decoders coupled to the word lines, and a plurality of bit line decoders coupled to the bit lines, forming a first abutting arrangement of a first plurality of the word line decoders and a first plurality of the bit line decoders, forming a second abutting arrangement of a second plurality of the word line decoders and a second plurality of the bit line decoders, and forming a region surrounding and separating the first abutting arrangement and the second abutting arrangement. The first abutting arrangement and the second abutting arrangement are formed to maximize an amount of continuous space in the region.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A non-volatile memory comprising:
- a memory array comprising a plurality of non-volatile memory cells; and
- a first decoder module coupled to the memory array, the first decoder module comprising:
  - a plurality of word line decoders coupled to the non-volatile memory cells;
  - a plurality of bit line decoders coupled to the non-volatile memory cells;
  - a first cluster comprising a first plurality of the word line decoders and the bit line decoders;
  - a second cluster comprising a second plurality of the word line decoders and the bit line decoders;
- a region surrounding and separating the first cluster and the second cluster, wherein the first plurality of the word line decoders and the bit line decoders abut one another and the second plurality of the word line decoders and the bit line decoders abut one another;
- a plurality of word line hookup regions each disposed along an edge of a corresponding one of the word line decoders; and
- a plurality of bit line hookup regions each disposed along an edge of a corresponding one of the bit line decoders.

2. The non-volatile memory of claim 1, further comprising:
- a plurality of word line hookup regions each disposed along an edge of a corresponding one of the word line decoders,
- wherein each word line hookup region is disposed between a word line decoder and an adjacent bit line decoder.

3. The non-volatile memory of claim 1, further comprising:
- a plurality of bit line hookup regions each disposed along an edge of a corresponding one of the bit line decoders,
- wherein the bit line hookup regions are all disposed on a common axis.

4. The non-volatile memory of claim 1, further comprising:
- a plurality of word line hookup regions each disposed along an edge of a corresponding one of the word line decoders,
- wherein the first cluster comprises word line hookup regions disposed along a first common axis and the second cluster comprises word line hookup regions disposed along a second common axis.

5. The non-volatile memory of claim 1, further comprising:
- a plurality of word line hookup regions each disposed in a corresponding one of the word line decoders; and
- a plurality of bit line hookup regions each disposed in a corresponding one of the bit line decoders, wherein the word line hookup regions and the bit line hookup regions are disposed end-to-end substantially orthogonal to one another.

6. The non-volatile memory of claim 1, further comprising:
- a plurality of word line hookup regions each disposed in a corresponding one of the word line decoders; and
- a plurality of bit line hookup regions each disposed in a corresponding one of the bit line decoders, wherein the word line hookup regions and the bit line hookup regions are disposed end-to-end in a diagonal zigzag pattern.

7. The non-volatile memory of claim 1, further comprising:
- a plurality of bit line hookup regions each disposed along an edge of a corresponding one of the bit line decoders,
- wherein each bit line hookup region is disposed between a bit line decoder and an adjacent word line decoder.

8. The non-volatile memory of claim 1, wherein the region is configured to accommodate one of more of a current mirror, a voltage clamp, a sense amplifier, and level shifting logic.

9. The non-volatile memory of claim 1, further comprising:
- a second decoder module substantially identical to the first decoder module, the second decoder module disposed adjacent the first decoder module,
- wherein the first cluster of the first decoder module abuts a second cluster of the second decoder module.

10. The non-volatile memory of claim 1, further comprising:
- a second decoder module substantially identical to the first decoder module, the second decoder module disposed adjacent the first decoder module,
- wherein the first cluster of the first decoder module is coupled to a second cluster of the second decoder module.

11. The non-volatile memory of claim 1, wherein:
- the memory array comprises a plurality of memory cells coupled to the plurality of word line decoders and the plurality of bit line decoders; and
- the plurality of memory cells each comprise a resistance-switching memory element.

12. The non-volatile memory of claim 11, wherein resistance-switching memory element comprises a magnetic memory element.

13. The non-volatile memory of claim 11, wherein the plurality of memory cells each comprise a selector element coupled in series with the resistance-switching memory element.

14. The non-volatile memory of claim 1, comprising a magnetoresistive random access memory.

15. A non-volatile memory comprising:
- a memory array;
- a decoder module coupled to the memory array, the decoder module comprising:
  - a plurality of word line decoders each comprising a word line hookup region coupled to a corresponding set of N word lines;
  - a plurality of bit line decoders each comprising a bit line hookup region coupled to a corresponding set of N bit lines;
  - a first plurality of the word line decoders abutting a first plurality of the bit line decoders;
  - a second plurality of the word line decoders abutting a second plurality of the bit line decoders; and
  - a region separating the first plurality of the word line decoders from the second plurality of the bit line decoders,
- wherein the region is configured to accommodate one of more of a current mirror, a voltage clamp, a sense amplifier, and level shifting logic; and
- a magnetoresistive random access memory.

16. The non-volatile memory of claim 15, wherein:
- the word lines and bit lines are disposed substantially orthogonal to one another;
- a non-volatile memory cell is disposed at each intersection of the word lines and the bit lines;
- each non-volatile memory cell comprises a corresponding path length from the memory cell to the corresponding word line hookup region and from the memory cell to the corresponding bit line hookup region; and
- a difference between a non-volatile memory cell comprising a longest path length and a shortest path length is 2.5×N.

17. The non-volatile memory of claim 15, wherein N=512.

18. A method comprising:
- forming a plurality of word lines and a plurality of bit lines orthogonal to the word lines;
- forming a decoder module comprising a plurality of word line decoders coupled to the word lines, and a plurality of bit line decoders coupled to the bit lines;
- forming a first abutting arrangement of a first plurality of the word line decoders and a first plurality of the bit line decoders;
- forming a second abutting arrangement of a second plurality of the word line decoders and a second plurality of the bit line decoders;
- forming a region surrounding and separating the first abutting arrangement and the second abutting arrangement,
- wherein the first abutting arrangement and the second abutting arrangement are formed to maximize an amount of continuous space in the region; and
- forming a plurality of word line hookup regions each disposed along an edge of a corresponding one of the word line decoders; and
- forming a plurality of bit line hookup regions each disposed along an edge of a corresponding one of the bit line decoders.

* * * * *